US012160050B2

United States Patent
Maeda et al.

(10) Patent No.: US 12,160,050 B2
(45) Date of Patent: Dec. 3, 2024

(54) PHASED-ARRAY ANTENNA DEVICE

(71) Applicant: JAPAN AEROSPACE EXPLORATION AGENCY, Chofu (JP)

(72) Inventors: Takashi Maeda, Chofu (JP); Naoya Tomii, Chofu (JP); Akihisa Uematsu, Chofu (JP); Kazuya Inaoka, Chofu (JP); Noriyuki Kawaguchi, Chofu (JP)

(73) Assignee: JAPAN AEROSPACE EXPLORATION AGENCY, Tokyo (JP)

( * ) Notice: Subject to any disclaimer, the term of this patent is extended or adjusted under 35 U.S.C. 154(b) by 411 days.

(21) Appl. No.: 17/784,246

(22) PCT Filed: Jun. 4, 2020

(86) PCT No.: PCT/JP2020/022185
§ 371 (c)(1),
(2) Date: Jun. 10, 2022

(87) PCT Pub. No.: WO2021/117269
PCT Pub. Date: Jun. 17, 2021

(65) Prior Publication Data
US 2023/0045598 A1    Feb. 9, 2023

(30) Foreign Application Priority Data
Dec. 12, 2019   (JP) ................. 2019-224449

(51) Int. Cl.
*H01Q 3/26*   (2006.01)
*G01R 29/08*   (2006.01)
*H01Q 13/02*   (2006.01)

(52) U.S. Cl.
CPC .......... *H01Q 3/2682* (2013.01); *G01R 29/08* (2013.01); *H01Q 13/0275* (2013.01)

(58) Field of Classification Search
CPC .. H01Q 3/2682; H01Q 13/0275; G01R 29/08; G01R 29/0878; G01S 2013/0263; G01S 7/03; Y02A 90/10
See application file for complete search history.

(56) References Cited

U.S. PATENT DOCUMENTS 4,990,925 A * 2/1991 Edelsohn ............. G01K 11/006
374/E11.003
5,724,044 A    3/1998 Tanaka
(Continued)

FOREIGN PATENT DOCUMENTS

CN    110448810 A    11/2019
EP    0 358 342 A1    3/1990
(Continued)

OTHER PUBLICATIONS

Dec. 1, 22, 2023 Extended European Search Report Issued in European Patent Application No. 20899133.1.
(Continued)

*Primary Examiner* — Bernarr E Gregory
*Assistant Examiner* — Juliana Cross
(74) *Attorney, Agent, or Firm* — Oliff PLC

(57) ABSTRACT

A phased-array antenna device with a long operating life without mechanical parts, has a high spatial resolution, and realizes microwave observation of broadband and high-frequency resolution. The phased-array antenna device performs direct A/D conversion through a BPF on an antenna analog signal amplified by an amplifier. Then, the device performs a second cross-spectrum calculation after conversion into complex frequency data through FFT. To detect a weak electromagnetic wave, the device repeatedly performs a second FFT over a long period and lastly performs integration.

5 Claims, 11 Drawing Sheets

(56) References Cited

U.S. PATENT DOCUMENTS 5,874,916 A * 2/1999 Desjardins .............. G01S 1/045
                                                                     455/137
2021/0364626 A1* 11/2021 Schoor .................... G01S 7/354

FOREIGN PATENT DOCUMENTS

| JP | S61-502075 A | 9/1986 |
| JP | H02-051074 A | 2/1990 |
| JP | H07-209359 A | 8/1995 |
| JP | H09-134113 A | 5/1997 |
| JP | H09-211045 A | 8/1997 |
| JP | 2007-303855 A | 11/2007 |

OTHER PUBLICATIONS

"Global Change Observation Mission—Water 'Shizuku' (GCOM-W)," Japan Aerospace Exploration Agency, 2012, [https://global.jaxa.jp/projects/sat/gcom_w/].
Camps et al., "Synthesis of Large Low-Redundancy Linear Arrays," IEEE Transactions on Antennas and Propagation, Dec. 2002, vol. 49, No. 12, pp. 1881-1883.
Sep. 1, 2020 International Search Report issued in International Patent Application No. PCT/JP2020/022185.

* cited by examiner

PHASED-ARRAY ANTENNA DEVICE

This invention is a phased-array antenna device that measures the microwave spectrum.

A microwave radiometer is an instrument that passively measures faint microwave power emitted from the Earth's surface. Every object emits faint electromagnetic waves known as blackbody radiation, based on its physical temperature. The microwave radiometer measures the power of blackbody radiation.

The applicant operates an artificial satellite equipped with a microwave radiometer disclosed in Non-Patent Literature 1. The satellite determines the sea surface temperature, sea surface salinity, soil moisture, and other data from microwave power measured as a brightness temperature.

Patent Literature 1 discloses the technical details of an electronic scanning microwave radiometer that enables single-area scanning of the Earth's surface from a conical footprint and a predetermined incident angle.

Non-Patent Literature 2 discloses the technical details related to the combination of numbers that reduces the redundancy of antenna elements of a phased-array antenna.

As disclosed in Non-Patent Literature 1, the microwave radiometer on the satellite currently in operation is equipped with multifrequency receivers with horn antennas and a disk-shaped reflector rotating at 40 rpm. The rotating parts, including a reflector, weigh about 250 kg. The currently installed radiometer, disclosed in Non-Patent Literature 1, has the following limitations.

(1) First, since current microwave radiometers perform scans by rotating their reflector, mechanically movable parts unavoidably deteriorate with age, which shortens the operating life.

(2) The current microwave radiometer would require a larger reflector to improve its spatial resolution. However, the size of the reflector is limited because of its rotation, so the spatial resolution is also low.

(3) Further, this radiometer has multifrequency receivers with horn antennas, but most frequency bands cannot be observed because each receiver's frequency band is narrow. Thus, most frequency bands are excluded from the observed targets.

(4) In addition, radio frequency interference (RFI) from ground sources, such as broadcasting stations and mobile phones, increases yearly, and frequency bands are affected as radio communications shift to higher frequencies. There is a concern that microwave radiometry will become unmanageably difficult soon.

This invention aims to provide a phased-array antenna device (the "device") that solves these problems, has a high spatial resolution, realizes ultra-wideband microwave observation in high resolution, and has a long operating life because it uses no mechanical parts.

The device consists of a first antenna element, a first preamplifier that amplifies the signal from the first antenna element, a first band-pass filter (BPF) that passes only signals from the first preamplifier that are around a predetermined frequency, and a first A/D converter that converts the analog output signal of the first BPF into digital data.

In addition, the device includes a first FFT that performs a Fourier transform on data from the first A/D converter, a second antenna element separated from the first antenna element by a specified distance, a second preamplifier that increases the signal from the second antenna element, and a second BPF that passes only the signal from the second preamplifier in the same frequency band as the first BPF.

The device includes a second A/D converter that converts the output signal of the second BPF into digital data, a second FFT that performs a fast Fourier transform on the data output by the second A/D converter, and a first cross-spectrum calculation unit that multiplies the data from the first FFT by the data output by the second FFT for the same complex frequency component. This occurs after converting either the data output by the first FFT or the data output by the second FFT into a conjugate complex number. The device also has a clock control unit that supplies a sampling clock signal whose timing is shifted relative to the first second A/D converters.

This invention provides a phased-array antenna device with a high spatial resolution that realizes broadband microwave observation with high-frequency resolution. The device will have a long service life because of its lack of moving parts.

The following description of an embodiment clarifies problems, configurations, and effects other than those described above.

FIG. 9 is a schematic diagram conceptually showing the calculation of an integration unit.

A phased-array antenna that does not use mechanical components, as disclosed in Patent Literature 1, is advantageous to achieving a long operating life for the antenna device. However, the conventional analog technique requires an antenna element and a circuit for each frequency band.

However, dual-ridged and quad-ridged feed horn antennas with extremely broad frequency bands in the microwave range have appeared recently. In an embodiment of this invention, the device employs these antenna elements in a phased array and digitizes the signal processing for a broader bandwidth.

Phased-array antennas with a conventional structure make signal processing circuits redundant. According to the embodiment of this invention, the phased-array antenna device achieves non-redundancy with a minimum configuration of antenna elements and signal processing circuits by applying the technique disclosed in Non-Patent Literature 2.

Figure 1:
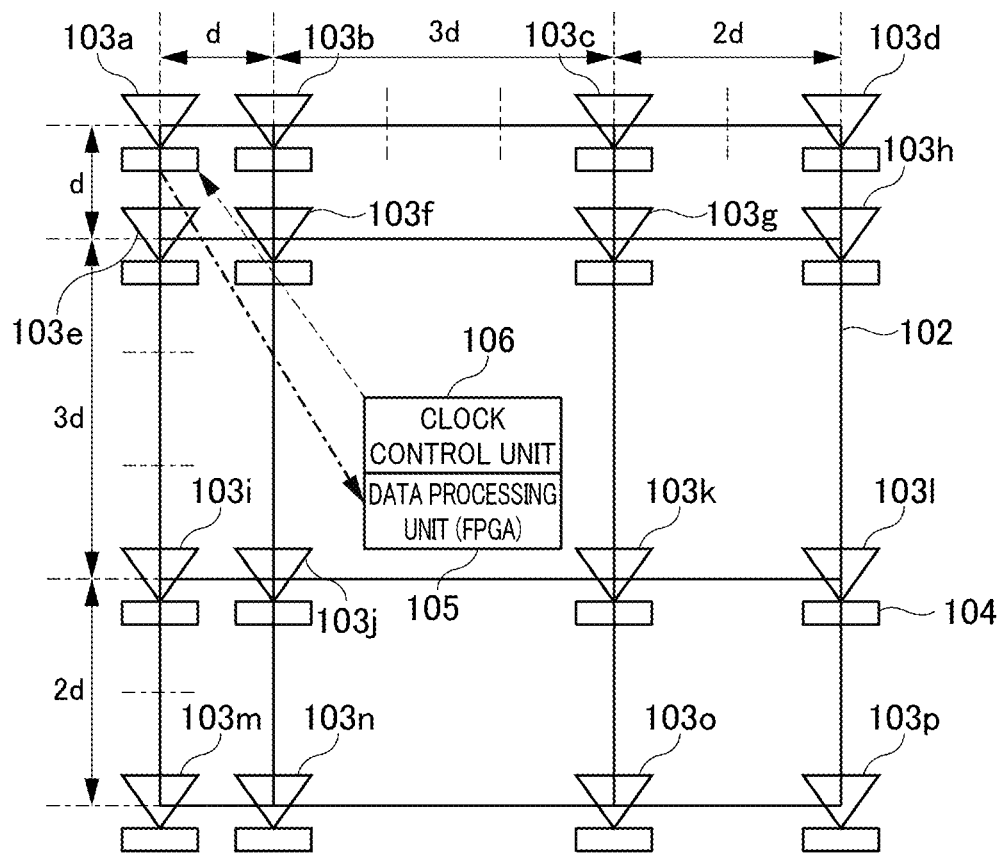
FIG. 1 is a schematic diagram of the overall configuration of the device according to the embodiment of this invention.

FIG. 1 is a schematic diagram of the overall configuration of a phased-array antenna device, 101, according to an embodiment of this invention.

The antenna elements, 103, and front-end units, 104, are installed at the intersections of the square frame, 102. The antenna elements, 103, are installed at positions corresponding to the zeroth, first, fourth, and sixth intersections at intervals of distance d.

The first-row, first-column antenna element, 103a, corresponding to the zeroth intersection, is at the left end of the first row of the frame, 102.

The first-row, second-column antenna element, 103b, corresponding to the first intersection, is distance d to the right of this antenna element, 103a.

The first-row, third-column antenna element, 103c, corresponding to the fourth intersection, is 3d to the right of the above antenna element, 103b.

The first-row, fourth-column antenna element, 103d, corresponding to the sixth intersection, is 2d to the right of the previous antenna element, 103c.

In the column direction, the first antenna element is d spaces from the zeroth antenna element, the fourth antenna element is 3d from the first antenna element, and the sixth antenna element is 2d from the fourth antenna element. The "1-3-2" spacing of the antenna elements, 103, is disclosed in Non-Patent Literature 2.

Also, in the second row of frame 102, a second-row first-column antenna element, 103e, a second-row second-column antenna element, 103f, a second-row third-column antenna element, 103g, and a second-row fourth-column antenna element, 103h, are separated by the same distances as noted in the first row described above.

In the third row of frame 102, a third-row, first-column antenna element, 103i, a third-row second-column antenna element, 103j, a third-row, third-column antenna element, 103k, and a third-row fourth-column antenna element, 103l, are separated by the same distances as noted in the first row described above.

Further, in the fourth row of frame 102, a fourth-row, first-column antenna element, 103m, a fourth-row second-column antenna element, 103n, a fourth-row, third-column antenna element, 103o, and a fourth-row, fourth-column antenna element, 103p, are separated by the same distances as noted in the first row described above.

The first-row, first-column antenna element, 103a, and the second-row first-column antenna element, 103e, are separated by d longitudinally. In other words, below the first-row, first-column antenna element, 103a, in the first column of the frame, 102, the second-row, first-column antenna element, 103e, corresponding to the first intersection, is installed distance d apart.

The second-row, first-column antenna element, 103e, and the third-row, first-column antenna element, 103i, are separated by 3d longitudinally. In other words, below the second-row, first-column antenna element, 103e, in the first column of frame 102, the third-row, first-column antenna element, 103i, corresponds to the fourth intersection is installed and separated by 3d.

The third-row, first-column antenna element, 103i, and the fourth-row, first-column antenna element, 103m, are separated by 2d longitudinally. In other words, below the third-row, first-column antenna element, 103i, in the first column of frame 102, the fourth-row, first-column antenna element, 103m, corresponds to the sixth intersection is installed and separated by 2d.

Similarly, in the row direction, the zeroth antenna element and the first antenna element are separated by d, the first antenna element and the fourth antenna element are separated by 3d, and the fourth antenna element and the sixth antenna element are separated by 2d.

In addition, this "0-1-4-6" combination of the antenna elements, 103, is a combination with high circuit utilization efficiency for eliminating redundancy in the final addition processing of the device, 101. This combination is also disclosed in Non-Patent Literature 2.

Note that, as distance d increases, the spatial resolution of the antenna improves similarly to the diameter of the reflector of a parabolic antenna. However, distance d is limited by the size of the mounted equipment.

The array antenna receives radio signals arriving within a specified narrow angular range with high sensitivity if several antenna elements, 103, are installed, and the signals from the antenna elements are superimposed with a time difference. Conversely, at transmission time, an array antenna can transmit a radio wave in a desired narrow angular range with high output by giving a time difference to transmitted signals output to the respective antenna elements. In particular, when a broadband radio wave is received, as in the case of the phased-array antenna device, 101, according to the embodiment of this invention, the frequency bands of the antenna elements, 103, may be different. The frequency bands that the entire array antenna can receive are frequency bands that each antenna element can receive.

In the known phased-array antenna disclosed in Patent Literature 1, several antenna elements, 103, are arrayed in a straight line at equal intervals (d) to enhance directivity, and the multiplication output of output signals of the antenna elements, 103, or the multiplication output after integration are added. This addition sharpens the antenna's directivity and reduces the side lobes.

The following combinations are obtained when the seven antenna elements, 103, are arranged at equal intervals according to the conventional technique.

TABLE 1

| Distance | Combination |
| --- | --- |
| d | 0-1, 1-2, 2-3, 3-4, 4-5, 5-6 |
| 2 × d | 0-2, 1-3, 2-4, 3-5, 4-6 |
| 3 × d | 0-3, 1-4, 2-5, 3-6 |
| 4 × d | 0-4, 1-5, 2-6 |
| 5 × d | 0-5, 1-6 |
| 6 × d | 0-6 |

However, when the antenna elements, 103, are arranged at "0-1-4-6," the following combinations are obtained.

TABLE 2

| Distance | Combination |
| --- | --- |
| d | 0-1 |
| 2 × d | 4-6 |
| 3 × d | 1-4 |
| 4 × d | 0-4 |
| 5 × d | 1-6 |
| 6 × d | 0-6 |

Although these combinations are disclosed in Non-Patent Literature 2, in the phased-array antenna device, 101, according to the embodiment of this invention, the combination of the antenna elements, 103, is developed on the longitudinal and lateral planes to sharpen the antenna directivity in the two longitudinal and lateral directions and to form a point-like antenna beam. Conventionally, 7×7=49 antenna elements, 103 and front ends have to be equipped, but the device, 101, according to the embodiment of this invention, requires only 4×4=16 antenna elements, 103, and front ends due to the combination excluding redundancy.

In addition, the combination of "0-1-4-6" is used in the device, 101, according to the embodiment of this invention, but if more antenna elements, 103, can be installed, it is possible to install the antenna elements, 103, using the numerical sequence disclosed in Non-Patent Literature 2 similarly to the above example. For example, when five antenna elements, 103, are installed, the spacing is set to "1-3-3-2," and the antenna elements, 103, are arranged at "0-1-4-7-9." Then, the following combinations are obtained.

TABLE 3

| Distance | Combination |
|---|---|
| d | 0-1 |
| 2 × d | 7-9 |
| 3 × d | 1-4, 4-7 |
| 4 × d | 0-4 |
| 5 × d | 4-9 |
| 6 × d | 1-7 |
| 7 × d | 0-7 |
| 8 × d | 1-9 |
| 9 × d | 0-9 |

The antenna element, 103, installed at each intersection of frame 102, is described.

Figure 2:
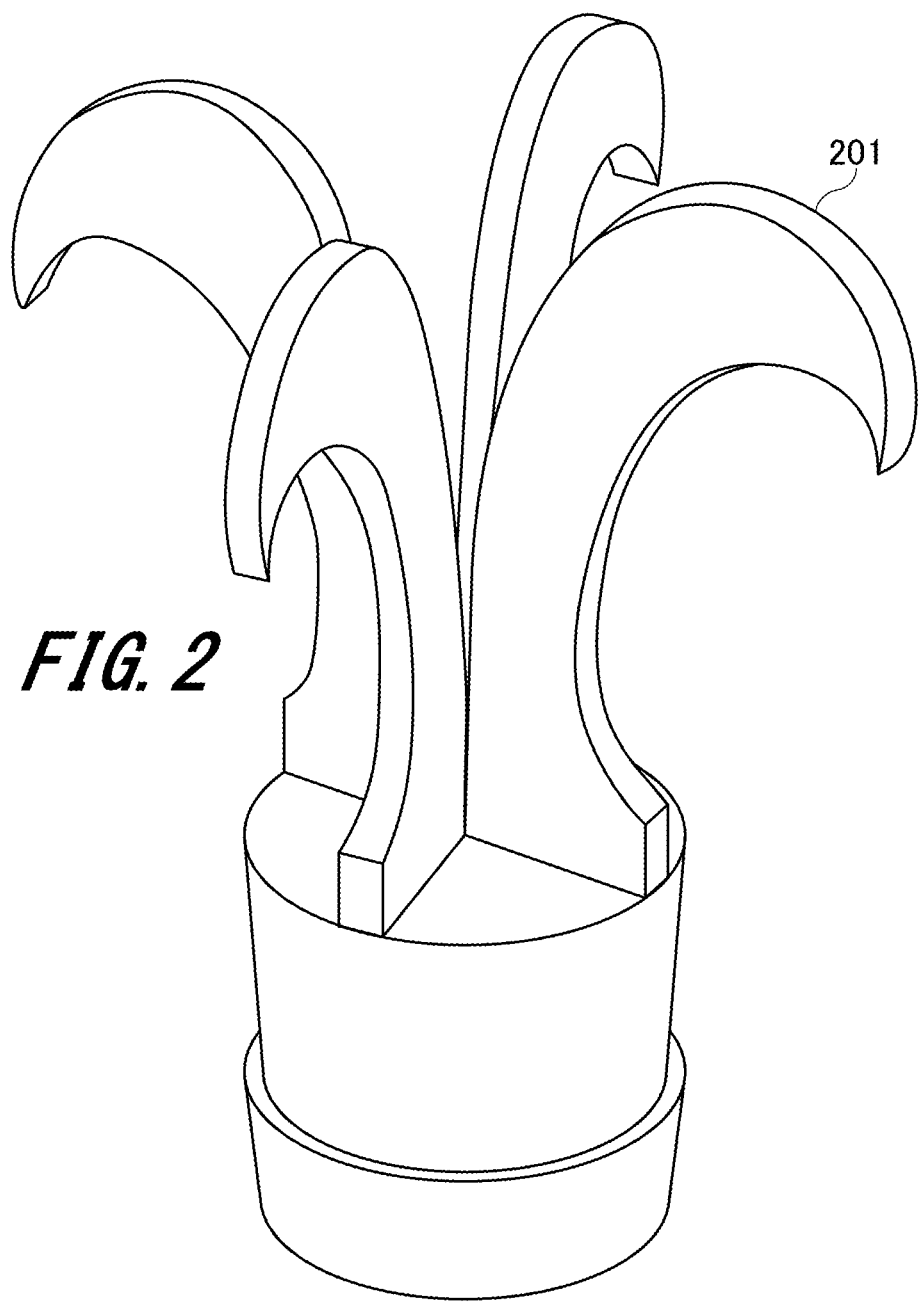
FIG. 2 is an external perspective view of an antenna element.

FIG. 2 is an external perspective view of the antenna element, 103.

The antenna element, 103, is a quad-ridged feed horn antenna. Examples include the QH1400 and QH4000 manufactured by MVG Industries in France. In this quad-ridged feed horn antenna, horn antenna elements, 201, each having a shape warped longitudinally and laterally in the top view, are formed. The horn antenna elements, 201, each having a warped shape, achieve an extremely broad frequency band in the microwave range of antenna elements, 103.

Returning to FIG. 1, the description of the overall configuration of the phased-array antenna device, 101, is continued.

The front-end unit, 104, is installed immediately below each antenna element, 103. The front-end unit, 104, includes a preamplifier, a distributor, a BPF, an A/D converter, and a register (see FIG. 3). An analog signal obtained from each antenna element, 103, is converted into digital data immediately below the antenna element, 103.

The digital data obtained from the register is aggregated into a data processing unit, 105, installed in the center part of frame 102. The data processing unit, 105, is constituted by a known field-programmable gate array (FPGA). The data processing unit, 105, outputs radio wave intensity data for each desired frequency component.

In addition to the data processing unit, 105, a clock control unit, 106, is installed in the center part of frame 102. The clock control unit, 106, supplies a sampling clock to the A/D converter inside the front-end unit, 104, immediately below each antenna element, 103.

Although not shown in FIG. 1, the front-end units, 104, installed immediately below the respective antenna element, 103, are connected to the data processing unit, 105, and the clock control unit, 106.

Figure 3:
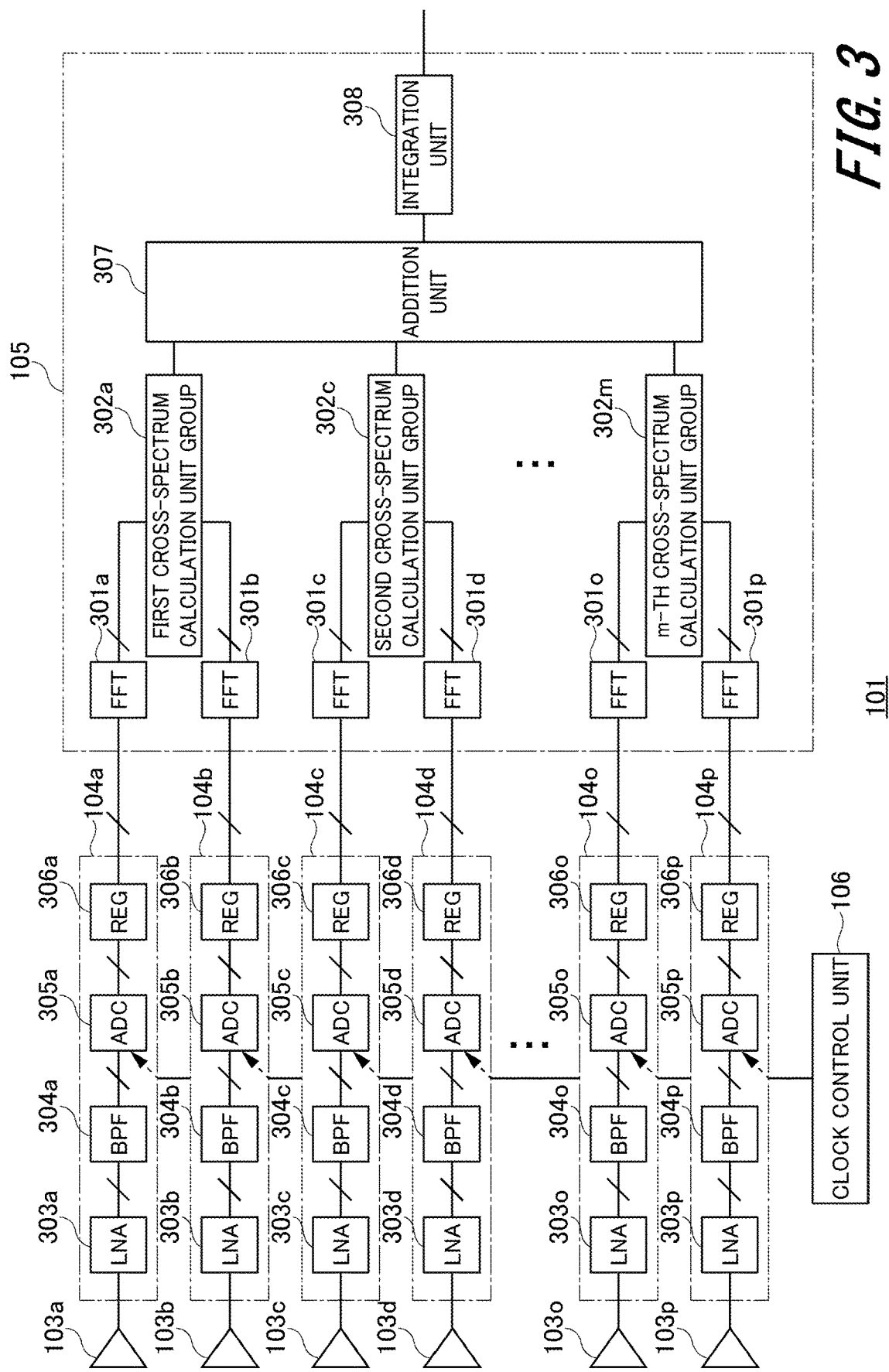
FIG. 3 is a block diagram of the overall configuration of the device.

FIG. 3 is a block diagram showing the overall configuration of the phased-array antenna device, 101.

The first-row, first-column antenna element, 103a, the first-row, first-column front-end unit, 104a, and a first-row, first-column FFT group, 301a, which is a fast Fourier transform unit inside the data processing unit, 105, constitute one system of signal processing and data processing.

Similarly, the first-row second-column antenna element, 103b, the first-row second-column front-end unit, 104b, and a first-row second-column FFT group, 301b, constitute one signal- and data-processing system.

Similarly, the first-row, third-column antenna element, 103c, the first-row, third-column front-end unit, 104c, and a first-row, third-column FFT group, 301c, constitute one signal- and data-processing system, and the same applies subsequently.

The first-row, fourth-column antenna element, 103d, the first-row, fourth-column front-end unit, 104d, and a first-row, fourth-column FFT group, 301d, constitute one signal- and data-processing system.

The descriptions for the second row, first column to the fourth row, second column are omitted.

The fourth-row, third-column antenna element, 103o, the fourth-row, third-column front-end unit, 1040, and a fourth-row, third-column FFT group, 301o, constitute one signal- and data-processing system.

The fourth-row, fourth-column antenna element, 103p, the fourth-row, fourth-column front-end unit, 104p, and a fourth-row, fourth-column FFT group, 301p, constitute one signal- and data-processing system.

Figure 5:
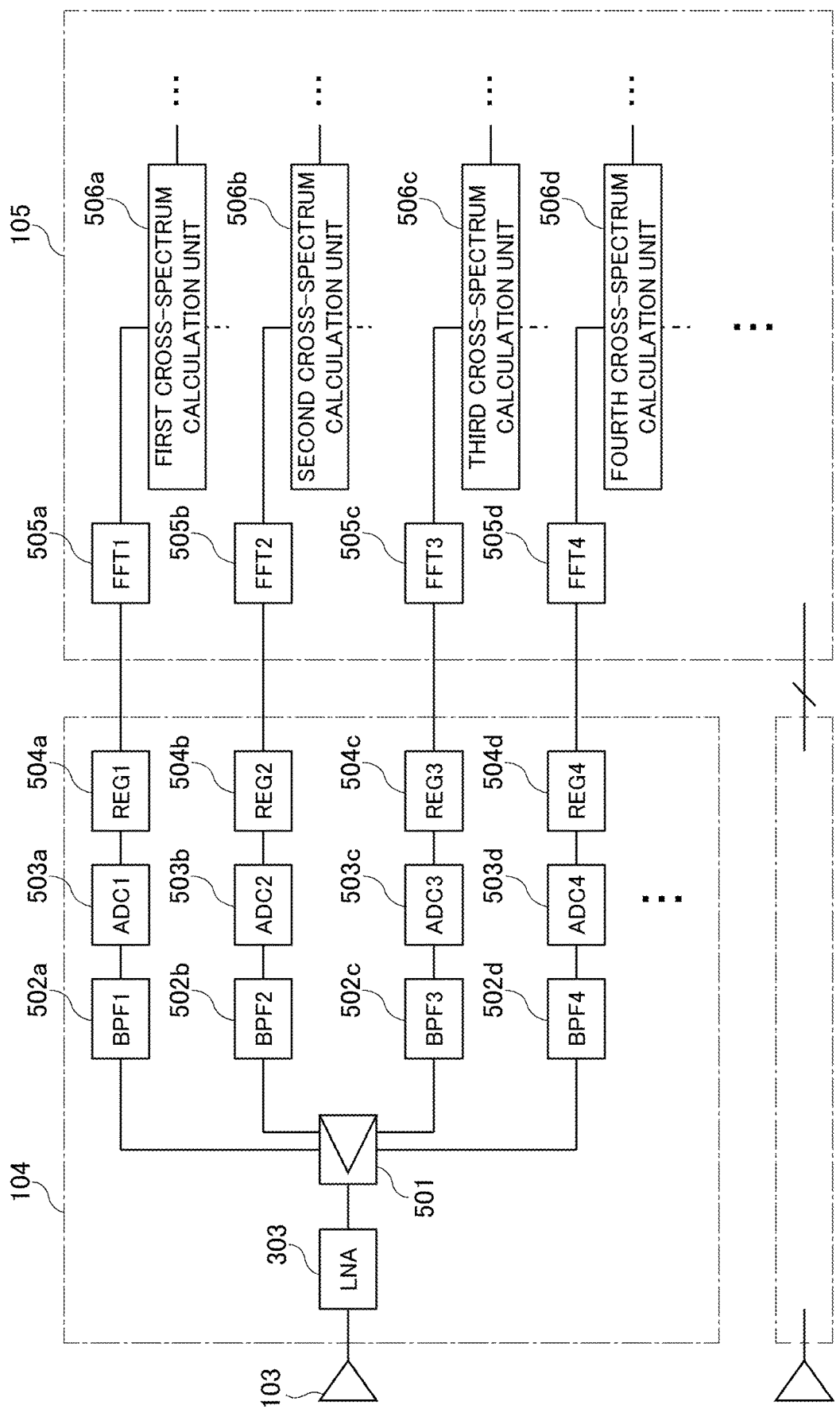
FIG. 5 is a block diagram of the functional configuration of one system of the device.

The signal output from the first-row, first-column antenna element, 103a, is amplified by a first-row, first-column preamplifier, 303a ("LNA" in FIGS. 3 and 5). The output signal of the first-row, first-column preamplifier, 303a, is input to a first-row, first-column BPF group, 304a ("BPF" in FIG. 3), which is a BPF group. Although FIG. 3 shows a single BPF, several BPFs are provided for each frequency band (FIG. 5). For ease of explanation, a functional block for signal processing and data processing linked from a single antenna element, 103, is referred to as one system in the following description. The front-end unit, 104, is provided immediately below an antenna element, 103, and the FFT group, 301, which is provided inside the data processing unit, 105, corresponds to the front-end unit, 104, belonging to one system.

Similarly, the signal output from the first-row second-column antenna element, 103b, is amplified by a first-row second-column preamplifier, 303b. The output signal of the first-row second-column preamplifier, 303b, is input to a first-row second-column BPF group, 304b.

Similarly, the output signal of the first-row, third-column antenna element, 103c, is input to a first-row, third-column BPF group, 304c, through a first-row, third-column preamplifier, 303c, and the same applies subsequently.

The output signal of the first-row, fourth-column antenna element, 103d, is input to a first-row, fourth-column BPF group, 304d, through a first-row, fourth-column preamplifier, 303d.

The descriptions for the second row, first column to the fourth row, second column are omitted.

The output signal of the fourth-row, third-column antenna element, 103o, is input to a fourth-row, third-column BPF group, 304o, through a fourth-row, third-column preamplifier, 303o.

The output signal of the fourth-row, fourth-column antenna element, 103p, is input to a fourth-row, fourth-column BPF group, 304p, through a fourth-row, fourth-column preamplifier, 303*p*. After this, the first-row, first-column preamplifier, 303*a*, to the fourth-row, fourth-column preamplifier, 303*p*, are collectively referred to as a preamplifier, 303, unless distinguished.

The output signal of the first-row, first-column BPF group, 304*a*, is supplied to a first-row, first-column A/D converter group, 305*a* ("ADC" in FIGS. 3 and. 5). Although FIG. 3 shows a single A/D converter, several A/D converters are provided for each frequency band, as described later (FIG. 5). Then, the clock control unit, 106, supplies a sampling clock to a first-row, first-column A/D converter group, 305*a*.

The sampling clock is, for example, 16.384 GHz (16, 384×10$^6$ Hz). In addition, the sampling clock is an integral multiple of a power of two. This depends on the convenience of the subsequent FFT group, 301. The reason that the sampling clock is an integral multiple of a power of two is described later.

Similarly, the output signal of the first-row second-column BPF group, 304*b*, is supplied to a first-row, second-column A/D converter group, 305*b*.

The output signal of the first-row, third-column BPF group, 304*c*, is supplied to a first-row, third-column A/D converter group, 305*c*.

The output signal of the first-row, fourth-column BPF group, 304*d*, is supplied to a first-row, fourth-column A/D converter group, 305*d*.

The descriptions for the second row, first column to the fourth row, second column are omitted.

The output signal of the fourth-row, third-column BPF group, 304*o*, is supplied to a fourth-row, third-column A/D converter group, 305*o*.

The output signal of the fourth-row, fourth-column BPF group, 304*p*, is supplied to a fourth-row, fourth-column A/D converter group, 305*p*.

After this, the first-row, first-column A/D converter group, 305*a*, to the fourth-row, fourth-column A/D converter group, 305*p*, are collectively referred to as an A/D converter group, 305, unless distinguished.

The sampling clock generated by the clock control unit, 106, is supplied to the first-row, first-column A/D converter group, 305*a*, belonging to the first-row, first-column system, and the first-row, second-column A/D converter group, 305*b*, belonging to the first-row, second-column system. At this time, to give a relative phase difference to received signals of the two antenna systems, the clock control unit, 106, gives a temporal difference to the sampling-clock supply timing according to a target direction in which the phased-array antenna device, 101, receives radio waves.

For example, it is assumed that the sampling clock is shifted by two samples between the zeroth antenna element, 103, and the first antenna element, 103, separated by d. Between the other antenna elements, 103, according to the natural number multiple of the distance, the sampling clock is shifted by the same natural number multiple.

First, the sixth antenna element, 103, is 2d from the fourth antenna element, 103, and the sampling clock is shifted by 2×2=4 samples.

Next, the fourth antenna element, 103, is 3d from the first antenna element, 103, and the sampling clock is shifted by 2×3=6 samples.

Then, the sampling clock is shifted by 2×4=8 samples between the zeroth antenna element, 103, and the fourth antenna element, 103, separated by 4d.

Then, between the first antenna element, 103, and the sixth antenna element, 103, separated by 5d, the sampling clock is shifted by 2×5=10 samples.

Lastly, between the zeroth antenna element, 103, and the sixth antenna element, 103, separated by 6d, the sampling clock is shifted by 2×6=12 samples.

The data output from the first-row, first-column A/D converter group, 305*a*, is stored in a first-row, first-column register group, 306*a* (denoted as "REG" in FIG. 3). Since the A/D converter group, 305, is for the ultrahigh-speed sampling clock of 16.384 GHZ, the DRAMs used in general computers cannot keep up with the speed, and thus the output data of the A/D converter is held by high-speed registers. Although FIG. 3 illustrates a single register, a number of first-row, first-column register groups, 306*a*, is provided for each frequency band as described later (FIG. 5).

Similarly, the output signal of the first-row, second-column A/D converter group, 305*b*, is supplied to a first-row, second-column register group, 306*b*.

The output signal of the first-row, third-column A/D converter group, 305*c*, is supplied to a first-row, third-column register group, 306*c*.

The output signal of the first-row, fourth-column A/D converter group, 305*d*, is supplied to a first-row, fourth-column register group, 306*d*.

The descriptions for the second row, first column to the fourth row, second column are omitted.

The output signal of the fourth-row, third-column A/D converter group, 305*o*, is supplied to a fourth-row, third-column register group, 306*o*.

The output signal of the fourth-row, fourth-column A/D converter group, 305*p*, is supplied to a fourth-row, fourth-column register group, 306*p*.

After this, the first-row, first-column register group, 306*a*, to the fourth-row, fourth-column register group 306*p* are collectively referred to as a register group, 306, unless distinguished.

The data output from the first-row, first-column register group, 306*a*, is supplied to a first-row, first-column FFT group, 301*a* ("FFT" in FIG. 3).

The first-row, first-column FFT group, 301*a*, is a collection of several FFTs, and a single FFT handles, for example, known input data for 1024 points. Then, a known fast Fourier transform is performed on the 1024 pieces of sample data held in the first-row, first-column register group, 306*a*, to convert the sample data into 512 pairs of complex frequency data. This processing is repeated for every 1024 samples of the input finite length digital data.

Similarly, the output data of the first-row, second-column register group, 306*b*, is supplied to a first-row, second-column FFT group, 301*b*.

The output data of the first-row, third-column register group, 306*c*, is supplied to a first-row, third-column FFT group, 301*c*.

The output data of the first-row, fourth-column register group, 306*d*, is supplied to a first-row, fourth-column FFT group, 301*d*.

The descriptions for the second row, first column to the fourth row, second column are omitted.

The output data of the fourth-row, third-column register group, 306*o*, is supplied to a fourth-row, third-column FFT group, 301*o*.

The output data of the fourth-row, fourth-column register group, 306*p*, is supplied to a fourth-row, fourth-column FFT group, 301*p*.

After this, the first-row, first-column FFT group, 301*a*, to the fourth-row, fourth-column FFT group, 301*p*, are collectively referred to as an FFT group, 301, unless distinguished.

The output data of the first-row, first-column FFT group, 301*a*, and the output data of the first-row, second-column FFT group, 301*b*, are input to a first cross-spectrum calculation unit group, 302*a*. The first cross-spectrum calculation unit group, 302*a*, performs multiplication processing for each of the same complex frequency components after converting one of the output data of the first-row, first-column FFT group, 301*a*, and the output data of the first-row, second-column FFT group, 301*b*, into a conjugate complex number.

Similarly, the output data of the first-row, third-column FFT group, 301*c*, and the output data of the first-row, fourth-column FFT group, 301*d*, are input to a second cross-spectrum calculation unit group, 302*b*.

The descriptions for the second row, first column to the fourth row, second column are omitted.

Similarly, the output data of the fourth-row, third-column FFT group, 301*o*, and the output data of the fourth-row, fourth-column FFT group, 301*p*, are input to an m-th cross-spectrum calculation unit group, 302*m*.

After this, the first cross-spectrum calculation unit group, 302*a*, to the m-th cross-spectrum calculation unit group, 302*m*, are collectively referred to as a cross-spectrum calculation unit group, 302, unless distinguished.

Figure 4:
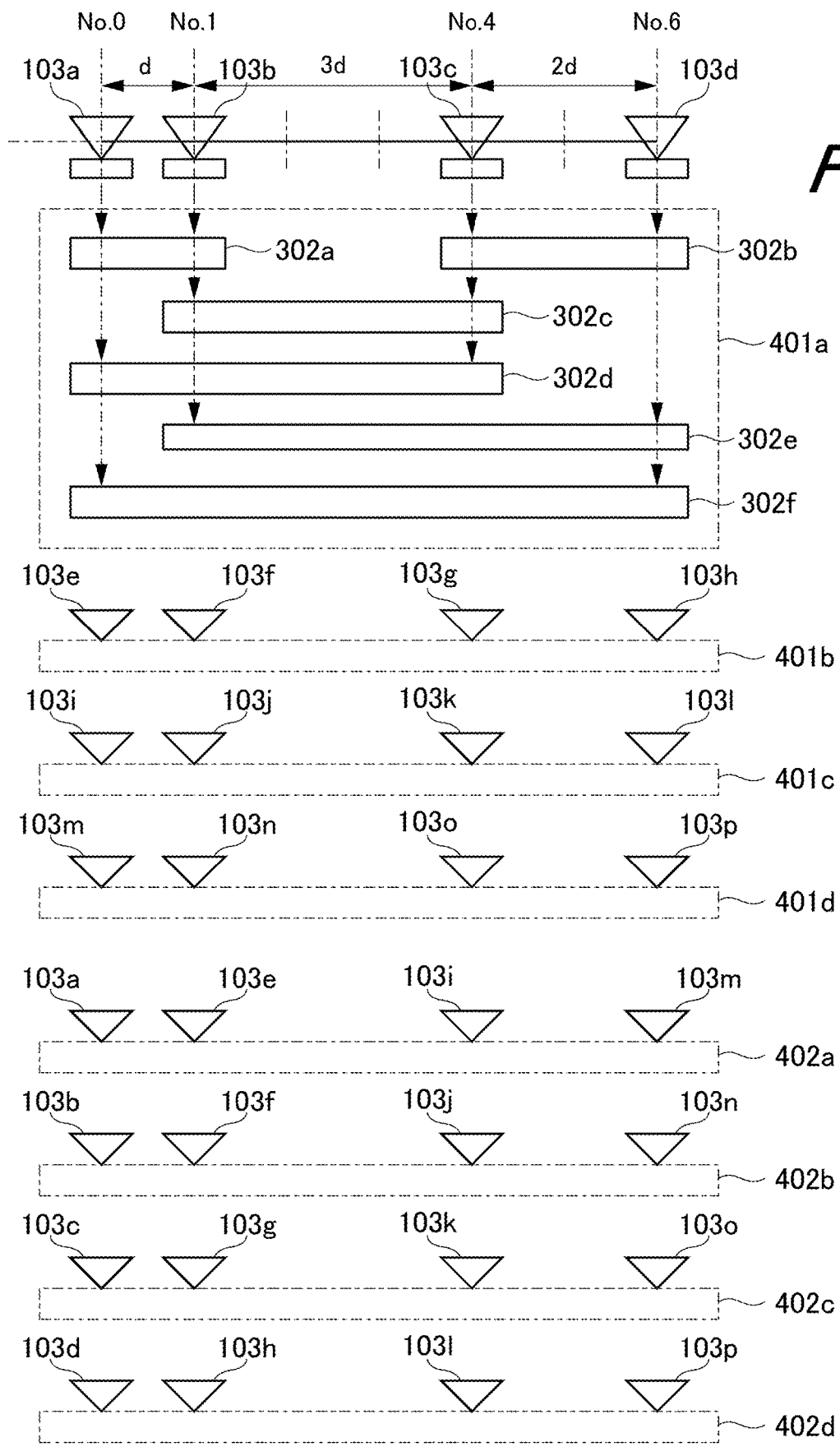
FIG. 4 is a schematic diagram of the number of mounted cross-spectrum calculation unit groups.

FIG. 4 is a schematic diagram showing the number of mounted cross-spectrum calculation unit groups, 302. To simplify the illustration and explanation, the front-end unit, 104, and the FFT group, 301, are not shown.

The data obtained from the first-row, first-column antenna element, 103*a*, and the data obtained from the first-row, second-column antenna element, 103*b*, are supplied to the first cross-spectrum calculation unit group, 302*a*.

The data obtained from the first-row, third-column antenna element, 103*c*, and the data obtained from the first-row, fourth-column antenna element, 103*d*, are supplied to the second cross-spectrum calculation unit group, 302*b*.

The data obtained from the first-row, second-column antenna element, 103*b*, and the data obtained from the first-row, third-column antenna element, 103*c*, are supplied to the third cross-spectrum calculation unit group, 302*c*.

The data obtained from the first-row, first-column antenna element, 103*a*, and the data obtained from the first-row, third-column antenna element, 103*c*, are supplied to the fourth cross-spectrum calculation unit group, 302*d*.

The data obtained from the first-row, second-column antenna element, 103*b*, and the data obtained from the first-row, fourth-column antenna element, 103*d*, are supplied to a fifth cross-spectrum calculation unit group, 302*e*.

The data obtained from the first-row, first-column antenna element, 103*a*, and the data obtained from the first-row, fourth-column antenna element, 103*d*, are supplied to a sixth cross-spectrum calculation unit group, 302*f*.

For each group of antennas in a row, six cross-spectrum calculation unit groups, 302, are defined as a cross-spectrum calculation group, 401.

The first-row, first-column antenna element, 103*a*, the first-row, second-column antenna element, 103*b*, the first-row, third-column antenna element, 103*c*, and the first-row, fourth-column antenna element, 103*d*, are a group of antenna elements belonging to one row.

The six cross-spectrum calculation unit groups, 302, of the first cross-spectrum calculation unit group, 302*a*, the second cross-spectrum calculation unit group, 302*b*, the third cross-spectrum calculation unit group, 302*c*, the fourth cross-spectrum calculation unit group, 302*d*, the fifth cross-spectrum calculation unit group, 302*e*, and the sixth cross-spectrum calculation unit group, 302*f*, that process the data obtained from the group of the antennas in one row are defined as a first cross-spectrum calculation group, 401*a*.

Similarly, the six cross-spectrum calculation unit groups, 302 (not shown), that process signals of the second-row, first-column antenna element, 103*e*, to the second-row, fourth-column antenna element, 103*h*, are defined as a second cross-spectrum calculation group, 401*b*.

The six cross-spectrum calculation unit groups, 302, (not shown) that process signals of the third-row, first-column antenna element, 103*i*, to the third-row, fourth-column antenna element, 103, are defined as a third cross-spectrum calculation group, 401*c*.

The six cross-spectrum calculation unit groups, 302 (not shown), that process signals of the fourth-row, first-column antenna element, 103*m*, to the fourth-row, fourth-column antenna element, 103*p*, are defined as a fourth cross-spectrum calculation group, 401*d*.

Next, for each group of antennas in a column, six cross-spectrum calculation unit groups, 302, are defined as a cross-spectrum calculation group, 402. The details of the cross-spectrum calculation group, 402, are the same as those of the cross-spectrum calculation group, 401.

The six cross-spectrum calculation unit groups, 302 (not shown), that process signals of the first-row, first-column antenna element, 103*a*, the second-row, first-column antenna element, 103*e*, the third-row, first-column antenna element, 103*i*, and the fourth-row, first-column antenna element, 103*m*, are defined as a fifth cross-spectrum calculation group, 402*a*.

The six cross-spectrum calculation unit groups, 302 (not shown), that process signals of the first-row, second-column antenna element, 103*b*, the second-row, second-column antenna element, 103*f*, the third-row, second-column antenna element, 103*j*, and the fourth-row, second-column antenna element, 103*n*, are defined as a sixth cross-spectrum calculation group, 402*b*.

The six cross-spectrum calculation unit groups, 302 (not shown), that process signals of the first-row, third-column antenna element, 103*c*, the second-row, third-column antenna element, 103*g*, the third-row, third-column antenna element, 103*k*, and the fourth-row, third-column antenna element, 103*o*, are defined as a sixth cross-spectrum calculation group, 402*c*.

The six cross-spectrum calculation unit groups, 302 (not shown), that process signals of the first-row, fourth-column antenna element, 103*d*, the second-row, fourth-column antenna element, 103*h*, the third-row, fourth-column antenna element, 103*l*, and the fourth-row, fourth-column antenna element, 103*p*, are defined as a sixth cross-spectrum calculation group, 402*d*.

As clarified from the above description, one cross-spectrum calculation unit group, 302, is provided for each two data processing systems. As described in FIG. 4, there are six cross-spectrum calculation unit groups, 302, for each set of antenna elements, 103, in a column. Since there are four sets of these groups in each longitudinal and lateral direction, there are 6×4×2=48 cross-spectrum calculation unit groups, 302, inside the data processing unit, 105.

The cross-spectrum component data for each complex frequency output from each cross-spectrum calculation unit group, 302, is input to the addition unit, 307. The addition unit, 307, performs addition processing of the cross-spectrum component data for each predetermined frequency range. Similar to the output data of the FFT group, 301, the cross-spectrum component data are complex number data and include a real part and an imaginary part. The addition unit, 307, performs addition processing on the complex number data for each of the same time and the same complex frequency component.

By this addition processing, output data of many cross-spectrum calculation unit groups, 302, are aggregated into complex number data for one system.

The output data of the addition unit 307 is input to an integration unit, 308.

The integration unit, 308, performs integration processing on $16 \times 10^6$ pieces of complex frequency data existing on the time axis of 1 s for each complex frequency component. Eventually, the complex frequency component data of the FFT group, 301, for a 1–s measurement is output from the integration unit, 308.

A conventional phased-array antenna, which is constituted only by analog signal processing, uses delay lines for delay processing. Several conducting wires of different lengths and delay lines of different lengths are selected by a switch according to the time delay; such delay lines are difficult to implement large delays.

In contrast, the phased-array antenna device, 101, according to the embodiment of this invention, uses a relative timing difference of sample clocks for the delay. Therefore, it is possible to set a large delay time.

In the following, more detailed data processing of the phased-array antenna device, 101, and how a signal input from the antenna element, 103, is converted into data output from the last integration unit, 308, are described with reference to the drawings.

FIG. 5 is a block diagram of the functional configuration of one system of the device, 101.

Figure 6A:
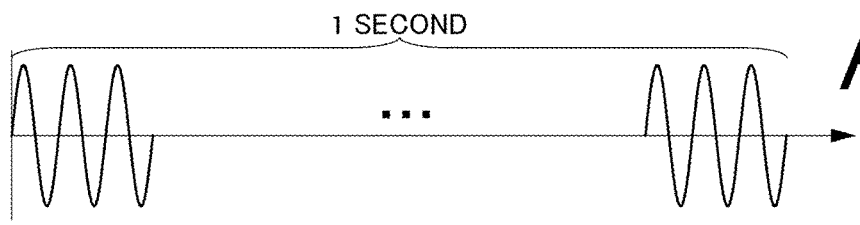
FIG. 6 is a schematic diagram conceptually illustrating the analog signal output from a preamplifier, digital data obtained from an A/D converter, complex frequency data obtained from an FFT, and the calculation of a cross-spectrum calculation unit.

FIG. 6A is a schematic diagram of the analog signal output from the preamplifier, 303.

Figure 6B:
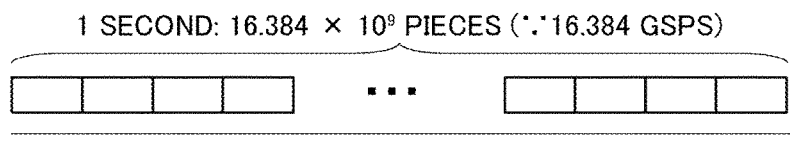

FIG. 6B is a schematic diagram of the digital data from an A/D converter, 503.

Figure 6C:
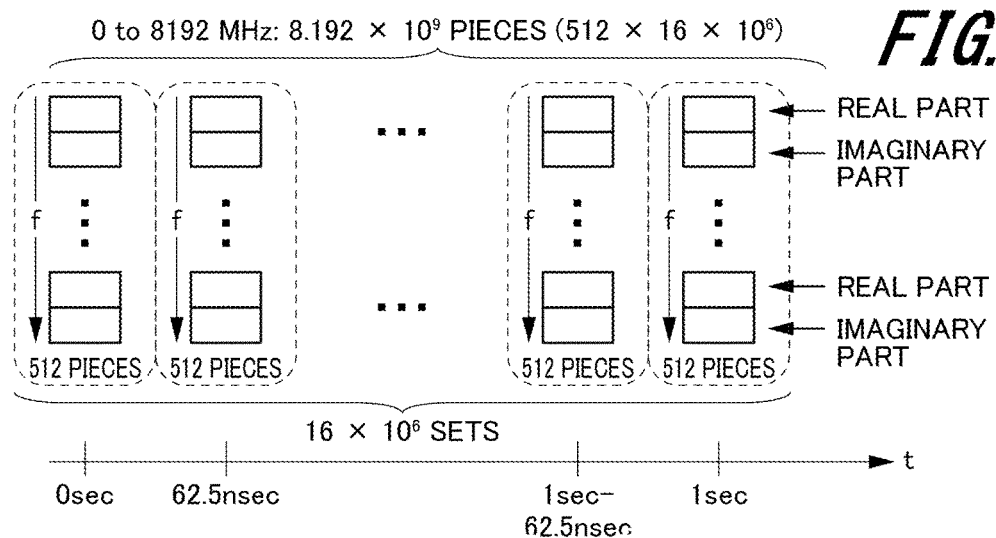

FIG. 6C is a schematic diagram of the complex frequency data from an FFT, 505.

Figure 6D:
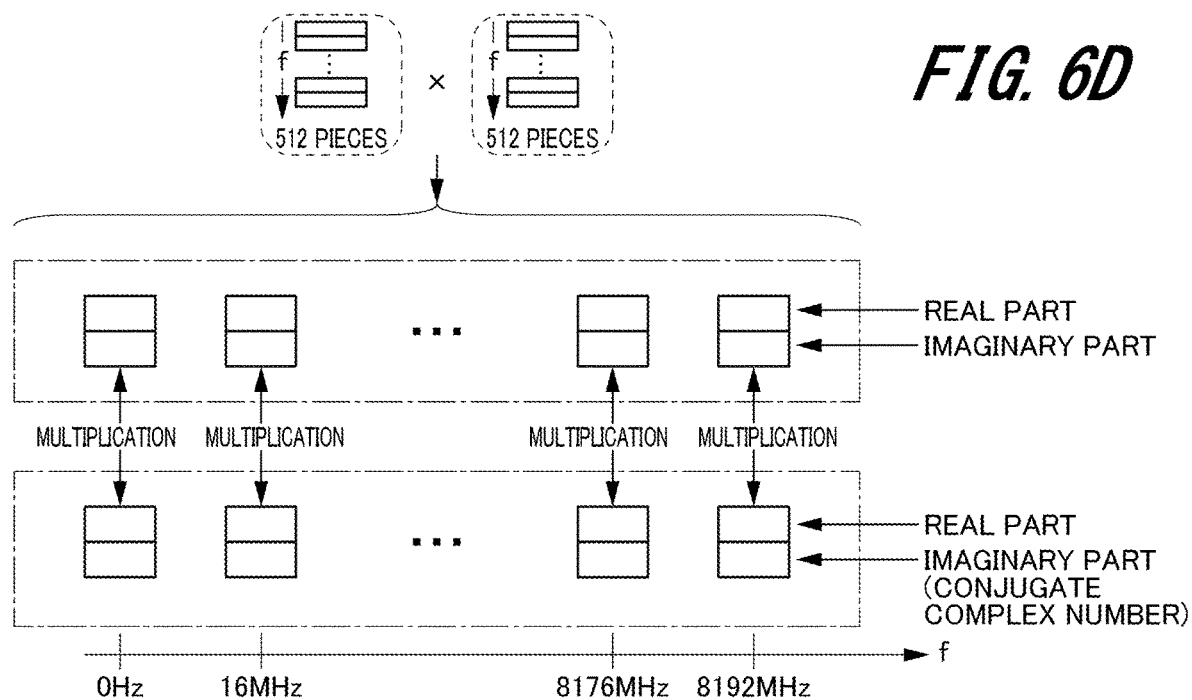

FIG. 6D is a schematic diagram of the calculation of a cross-spectrum calculation unit, 506.

As shown in FIG. 5, the signal output from antenna element, 103, is amplified by the preamplifier, 303. The output signal of the preamplifier, 303, as shown in FIG. 6A, is branched into a number of signals by a distributor, 501. After this, one row of functional circuit blocks that process several output signals from the distributor, 501, is a subsystem. The front-end unit, 104, and the FFT in one system connected to one antenna element, 103, are constituted by functional circuit blocks of several subsystems.

A first BPF, 502a ("BPF1" in FIG. 5), is the first BPF belonging to a first subsystem; it passes signals in the first band of 0 to 8192 MHz.

A second BPF, 502b ("BPF2" in FIG. 5), is the s BPF belonging to a second subsystem; it passes signals in the second band of 8192 to 16,384 MHz.

A third BPF, 502c ("BPF3" in FIG. 5), is a third BPF belonging to a third subsystem; it passes signals in the third band of 16,384 to 24,576 MHz.

A fourth BPF, 502d ("BPF4" in FIG. 5), is a fourth BPF belonging to a fourth subsystem; it passes signals in the fourth band of 24,576 to 32,768 MHz.

Although only the first to the fourth subsystems are shown in FIG. 5, more subsystems can be provided. In that case, BPFs for $(k-1) \times 8192$ to $k \times 8192$ MHz (k is a natural number) are provided.

As the first BPF, 502a, the second BPF, 502b, the third BPF, 502c, and the fourth BPF, 502d, are included in the respective subsystems, BPFs having an extremely steep shoulder characteristic are adopted to add an aliasing effect to be described later.

In the phased-array antenna device, 101, according to the embodiment of this invention, the sampling frequency is intentionally set to $16,384 \times 10^6$ Hz (16.384 GHZ) to set the interval of the frequency component that is the final output of the FFT to a manageable value (16 MHz) that is a natural number multiple of a hexadecimal number. As a result of performing the fast Fourier transform by the 1024-point FFT, the interval of the frequency component that is the final output is $(16,384/2)/512 = 16$ MHz.

In contrast, if the sampling frequency is set to 16 GHZ, a multiple of 16 MHz used frequently in conventional electronic circuits, the interval of the frequency component that is the final output is $(16000/2)/512 = 15.625$ MHz because the fast Fourier transform performs processing by the 1024-point FFT.

For example, when the order of 4000 MHz data is searched for in the data of each frequency component arranged at intervals of 16 MHz or 15.625 MHz, the former is the easiest method to derive the result.

From the viewpoint of product usability, the optimal sampling frequency is determined to set the interval of the final output to a manageable value.

Then, by setting the sampling frequency to an integral multiple of a power of two, the number of data samples can be handled as a power of two. In addition, data are easily analyzed because the intensity of the finally obtained frequency component is separated by every 16 MHz.

This sampling frequency setting and the frequency band setting described later enable seamless acquisition of the intensity of radio waves with frequency components in a broad frequency band, which cannot be achieved by the signal processing of a conventional analog circuit.

The output signal of the first BPF, 502a, of the first subsystem is input to a first A/D converter, 503a ("ADC1" in FIG. 5).

The output signal of the second BPF, 502b, of the second subsystem is input to a second A/D converter, 503b ("ADC2" in FIG. 5).

The output signal of the third BPF, 502c, of the third subsystem is input to a third A/D converter, 503c ("ADC3" in FIG. 5).

The output signal of the fourth BPF, 502d, of the fourth subsystem is input to a fourth A/D converter, 503d ("ADC4" in FIG. 5).

The functional blocks connected to the output side of each of the first BPF, 502a, the second BPF, 502b, the third BPF, 502c, and the fourth BPF, 502d, are the same circuit functional blocks in each subsystem.

The first A/D converter, 503a, the second A/D converter, 503b, the third A/D converter, 503c, and the fourth A/D converter, 503d, perform A/D conversion on an analog signal input from each BPF and outputs digital data as shown in FIG. 6B.

The first A/D converter, 503a, the second A/D converter, 503b, the third A/D converter, 503c, and the fourth A/D converter, 503d, are A/D converters having the same circuit configuration. Then, they perform A/D conversion with a sampling clock of 16.384 GHz.

After this, the first A/D converter, 503a, the second A/D converter, 503b, the third A/D converter, 503c, and the fourth A/D converter, 503d, are collectively referred to as an A/D converter, 503, unless distinguished.

Therefore, by Nyquist's theorem, the A/D converter, 503, can perform A/D conversion on signals with frequencies up to 8.192 GHz. Regarding signals above 8.192 GHz, signals that appear as a low frequency by applying aliasing are subjected to A/D conversion.

For example, a signal of 8.2 GHz passes through only the second BPF, 502*b*, of the s subsystem. Then, the signal is detected by the second A/D converter, 503*b*, as aliasing noise of 8200−8192=8 MHz. However, if the second A/D converter, 503*b*, performs a second A/D conversion on the 8 MHz signal, this is substantially equivalent to the A/D conversion of a signal of 8.2 GHz in practical.

As described above, the functional blocks connected to the output side of each of the first BPF, 502*a*, the second BPF, 502*b*, the third BPF, 502*c*, and the fourth BPF, 502*d*, are the same circuit functional blocks in each subsystem. The first A/D converter, 503*a*, the second A/D converter, 503*b*, the third A/D converter, 503*c*, and the fourth A/D converter, 503*d*, are A/D converters having the same circuit configuration.

A first register, 504*a* ("REG1" in FIG. 5), a second register, 504*b* ("REG2" in FIG. 5), a third register, 504*c* ("REG3" in FIG. 5), and a fourth register, 504*d* ("REG4" in FIG. 5), are registers having the same circuit configuration.

A first FFT, 505*a* ("FFT1" in FIG. 5), a second FFT, 505*b* ("FFT2" in FIG. 5), a third FFT, 505*c* ("FFT3" in FIG. 5), and a fourth FFT, 505*d*, ("FFT4" in FIG. 5) are FFTs having the same circuit configuration.

In addition, a first cross-spectrum calculation unit, 506*a*, a second cross-spectrum calculation unit, 506*b*, a third cross-spectrum calculation unit, 506*c*, and a fourth cross-spectrum calculation unit, 506*d*, connected to the respective subsystems have the same circuit configuration.

Therefore, to eliminate redundancy in the explanation, only the first subsystem that receives radio signals in the first band of 0 to 8196 MHz is described below.

After this, the first FFT, 505*a*, the second FFT, 505*b*, the third FFT, 505*c*, and the fourth FFT, 505*d*, are referred to as an FFT, 505, unless distinguished.

Similarly, the first cross-spectrum calculation unit, 506*a*, the second cross-spectrum calculation unit, 506*b*, the third cross-spectrum calculation unit, 506*c*, and the fourth cross-spectrum calculation unit, 506*d*, are referred to as a cross-spectrum calculation unit, 506, unless distinguished.

The first register 504*a* holds the output data of the first A/D converter, 503*a*. Then, the digital data held in the first register, 504*a*, is supplied to the first FFT, 505*a*.

The first FFT, 505*a*, performs a known fast Fourier transform on the sample data for one s held in the first register, 504*a*, for every 1024 pieces of sample data to convert the sample data into 512 pairs of complex frequency data. This processing is repeated for the sample data for 1 s.

The first register 504*a* stores 16,384×10$^6$ pieces of sample data. In contrast, the first FFT, 505*a*, performs a second FFT for every 1024 pieces of sample data. That is, the first FFT, 505*a*, performs a second FFT 16,384×10$^6$÷1024=16×10$^6$ times. Then, the digital data shown in FIG. 6B is converted into 16×10$^6$ sets of 512 pieces of complex frequency data, as shown in FIG. 6C.

In FIG. 6C, the 512 pieces of complex frequency data corresponding to the sample data held in the first register, 504*a*, for 1 s÷(16× 10$^6$)=62.5×10$^{-9}$ s=62.5 ns. Therefore, the scale interval on the horizontal axis in FIG. 6C is 62.5 ns.

The data shown in FIG. 6C is the result of the FFT processing on the signals of the radio waves in the first band of 0 to 8192 MHz in the first subsystem. This amount of data continues in the s subsystem, the third subsystem, the fourth subsystem, and so on for each different frequency band.

The complex frequency data output from the first FFT, 505*a*, is input to the first cross-spectrum calculation unit, 506*a*. For the complex frequency component data output from the FFTs of the two subsystems, the cross-spectrum calculation unit multiplies the data that is at the same time and of the same complex frequency component after reversing the signs of the complex components of the complex frequency component data output from one of the FFTs. Reversing the signs of the complex components of the complex frequency component data output from one of the FFTs means obtaining a conjugate complex number of the complex frequency component data output from one of the FFTs. This calculation is the defining equation for the cross-spectrum shown below.

$$X = G_1 G_2 V_0(f) V_0^*(f) e^{-j2\pi f \tau}$$

$$\Delta = c\tau = d \sin \theta, \quad \theta = \sin^{-1}(c\tau/d) \qquad \text{[Expression 1]}$$

where
X: Cross-spectrum,
$G_1$: Gain of first antenna,
$G_2$: Gain of second antenna,
$V_0(f)$: Frequency component of output signal of first antenna,
$V_0^*(f)$: Conjugate complex number of frequency component of output signal of first antenna,
τ: Phase difference,
Δ: Optical path difference,
c: Velocity of light,
d: Distance between antennas, and
θ: Azimuth.

Note that, in the above defining equation for the cross-spectrum, the term exp(−j2πfτ) indicates the azimuth is achieved by shifting the input timing of the sampling clock by the clock control unit, 106, in the A/D converter, 503.

FIG. 6D is a schematic diagram showing the calculation of complex frequency data at a particular time in the first cross-spectrum calculation unit, 506*a*. There are 512 pieces of complex frequency data output from an FFT of one system every 16 MHz from 0 Hz. These pieces of complex frequency data are multiplied by the pieces of complex frequency data of the corresponding frequency component of the other system after converting them into conjugate complex numbers.

Figure 7E:
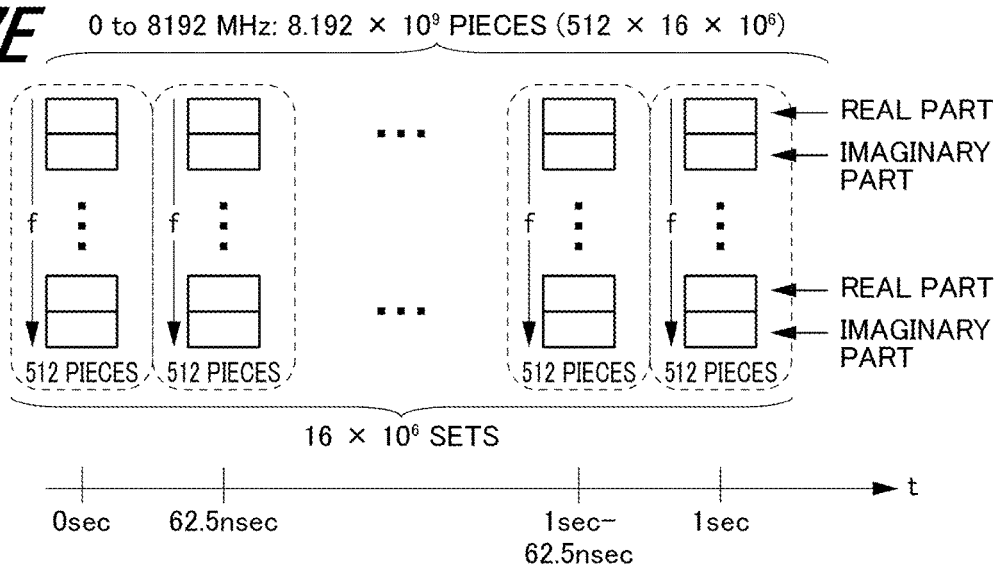
FIG. 7 is a schematic diagram conceptually illustrating a complex frequency component data group output from the cross-spectrum calculation unit and the overall image of the calculation of an addition unit.

FIG. 7E is a schematic diagram of a complex frequency component data group output from the first cross-spectrum calculation unit 506*a*. The multiplication of the complex frequency data output from the FFTs of two systems is performed, and the number and form of the data are the same as the output of the FFTs shown in FIG. 6C.

Figure 7F:
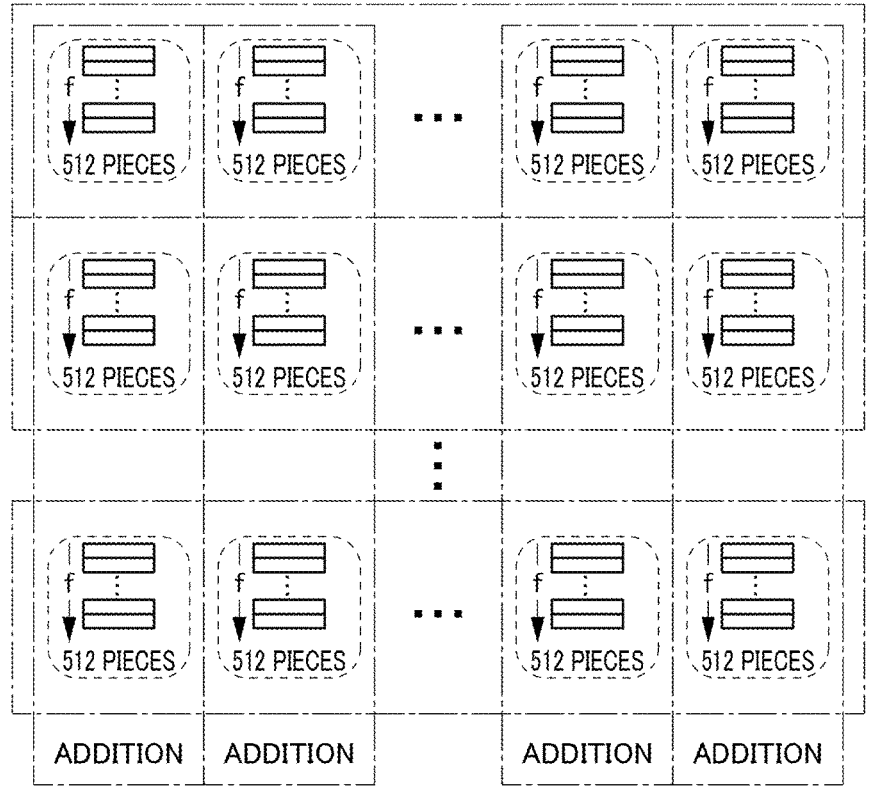

FIG. 7F is a schematic diagram of the overall image of a calculation of the addition unit, 307.

Figure 8G:
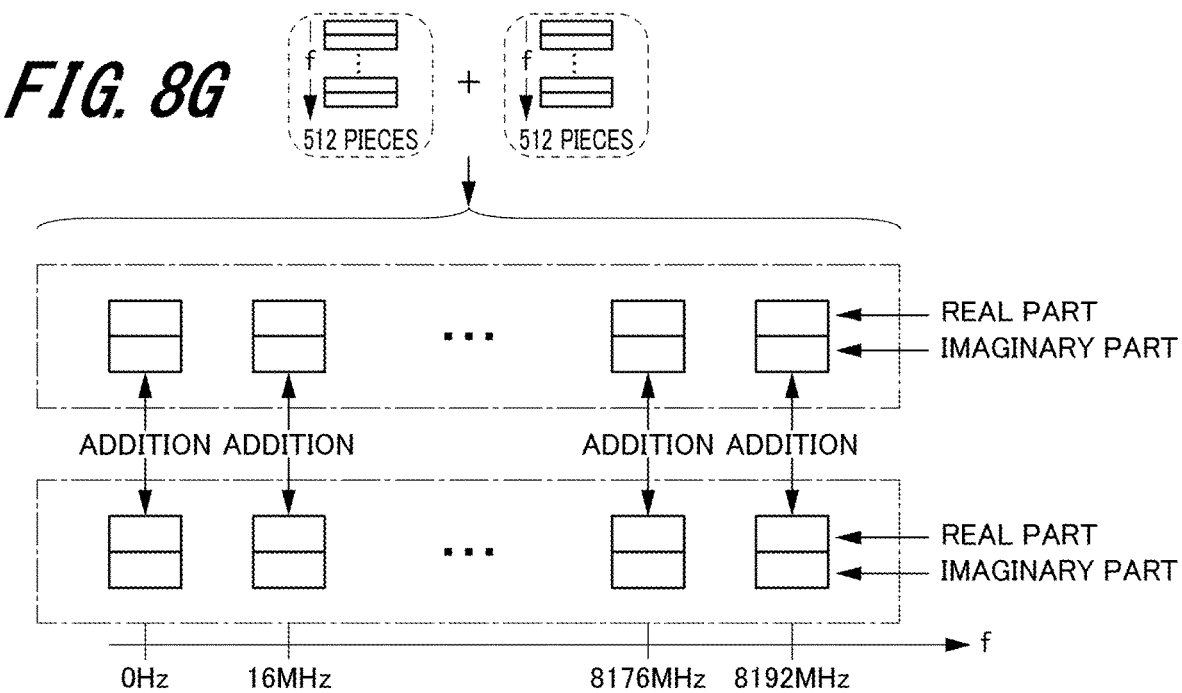
FIG. 8 is a schematic diagram conceptually showing a part of the calculation of the addition unit and a form of data output by the addition unit.

FIG. 8G is a schematic diagram of part of a calculation of the addition unit, 307.

As shown in FIG. 7F, the addition unit, 307, performs addition processing on the output data of a large number of cross-spectrum calculation units, 506, in the 6×6=36 sets of cross-spectrum calculation unit group, 302, included inside the data processing unit, 105, for the same time axis and the same frequency component. More specifically, as shown in FIG. 8G, the same frequency components are added together for the output data of two sets of FFTs on the same time axis.

Figure 8H:
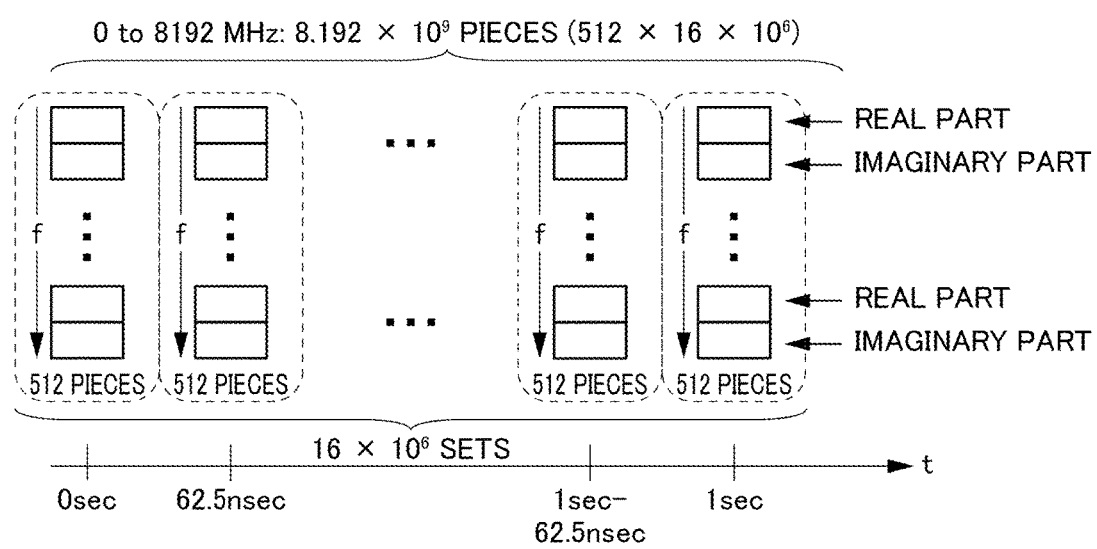
Figure 91:
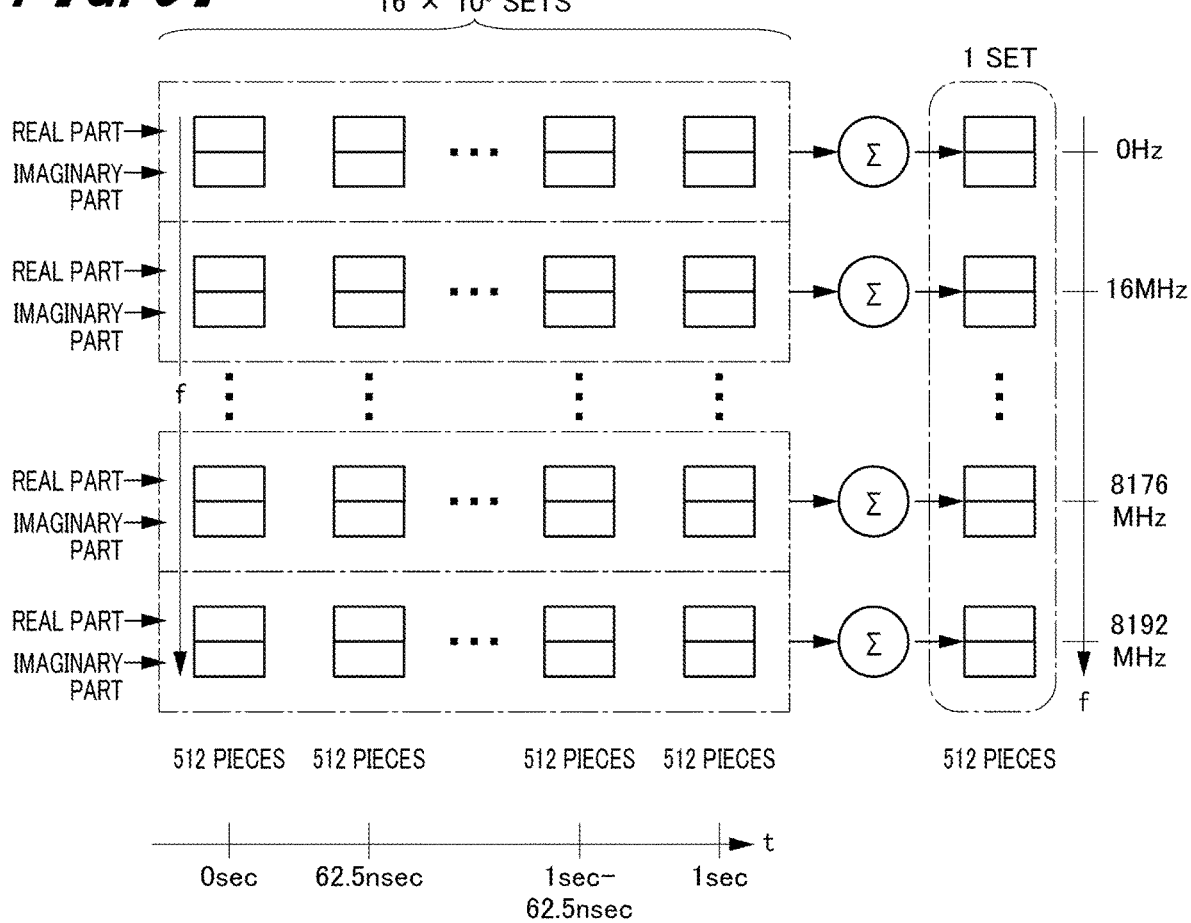

FIG. 8H is a schematic diagram of a form of the data output by the addition unit, 307.

The output data of many cross-spectrum calculation units, 506, are combined into one set by the addition unit, 307, and the form is the same as the form of the complex frequency data shown in FIGS. 6C and 7E.

FIG. 9I is a schematic diagram of a calculation of the integration unit, 308.

The integration unit, 308, performs integration processing on 512 sets of complex frequency data output from the addition unit 307, 16×10⁶ pieces in the time axis direction, for each frequency component. The integration of the integration unit, 308, is equivalent to the time integration of the output data of the addition unit, 307. Eventually, 512 sets of complex frequency data are obtained from the integration unit, 308.

To the FFT, 505, 1024 pieces of data are input. If the FFT, 505, is operated only once, data output from the A/D converter for 62.5 ns is used. However, RFI is generated by various devices on the ground. RFI caused by artificial radio waves is a powerful radio wave compared with weak electromagnetic waves generated by natural objects. For this reason, to remove the influence of RFI as much as possible, it is preferable to sufficiently reduce the influence of RFI by time integration for a long time. Thus, a measurement for a long time of 1 s is performed. The FFT, 505, is repeatedly operated for the obtained enormous digital data, and the cross-spectrum of each set of antennas is calculated. After adding the cross spectra, the integration unit, 308, performs the time integration.

FIGS. 6 to 9 show only the signal processing and data processing in the first band of 0 to 8.192 GHz. This processing is performed simultaneously with the second band of 8.192 to 16.384 GHz, the third band of 16.384 to 24.576 GHz, and the fourth band of 24.576 to 32.768 GHz.

Figure 10:
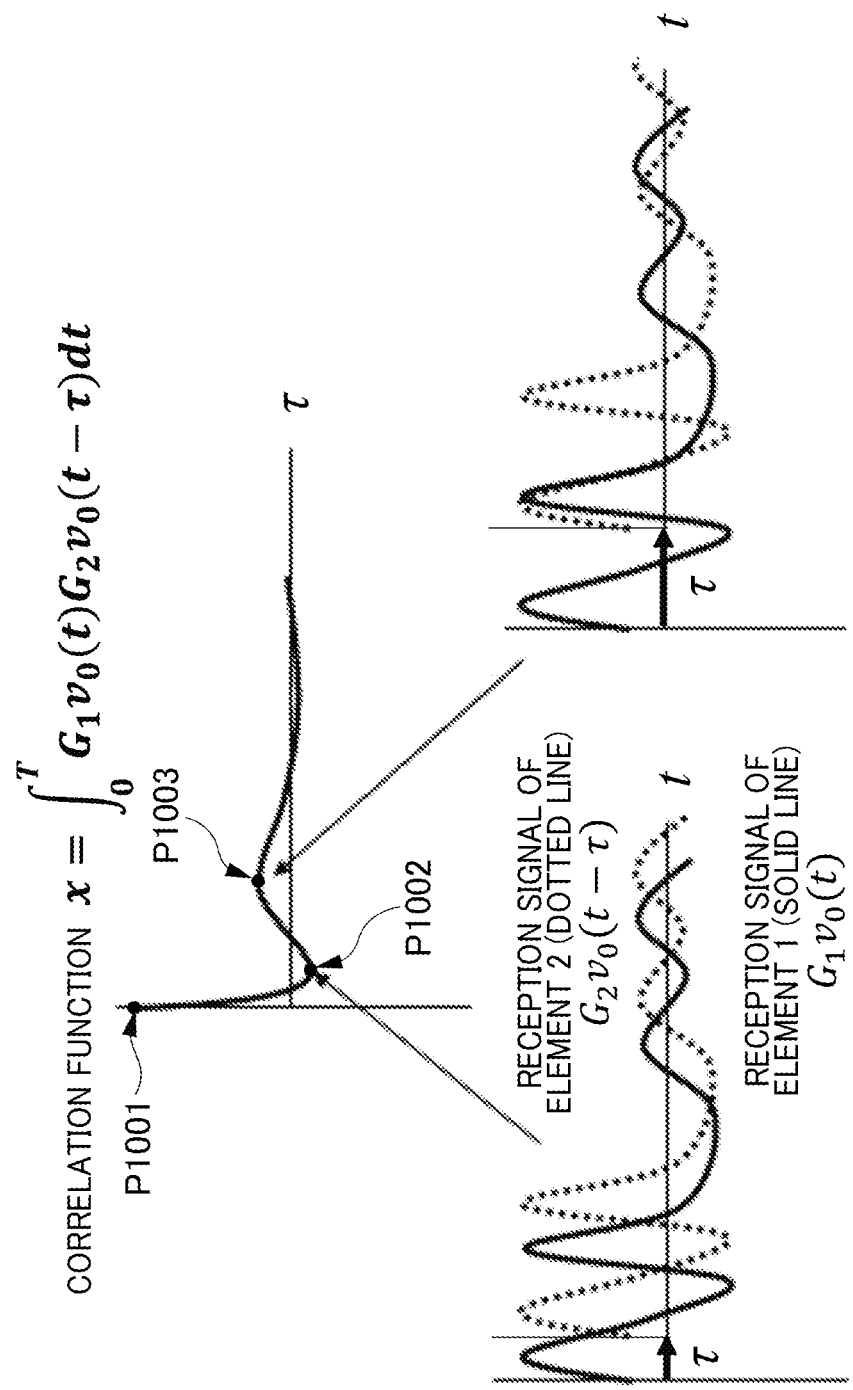
FIG. 10 is a conceptual diagram showing the operating principle of the device.

FIG. 10 is a diagram of the operating principle of the phased-array antenna device, 101.

When the output signals of the two antenna elements, 103, are multiplied and integrated at a specific time T, cross-correlation of the output signals of the two antennas at the integration time T can be obtained. The defining equation of cross-correlation is expressed by the following expression.

$$x = \int_0^T v(t)v(t-\tau)dt = \int_0^T G_1 v_0(t) G_2 v_0(t-\tau)dt \quad \text{[Expression 2]}$$

where,
x: Cross-correlation,
T: Integrated time,
v(t): Output signal of first antenna,
v(t−τ): Output signal of second antenna,
τ: phase difference,
$v_0(t)$: Frequency component of output signal of first antenna,
$G_1$: Gain of first antenna, and
$G_2$: Gain of second antenna.

In the above defining equation of the cross-correlation, t is a delay given to the antenna element, 103. FIG. 10 shows that the cross-correlation x is at the maximum value when τ is 0 (point P1001), x decreases as soon as τ starts to have a value (point P1002), x slightly increases as τ further increases (point P1003), and x converges to a value around 0 as τ increases. Therefore, if τ is electrically changed, it is possible to change the reception sensitivity azimuth of the cross-correlation obtained from the two antenna elements, 103.

To verify the validity of this invention, the inventors performed the same signal processing and data processing as shown in FIGS. 3 and 5, using two antenna elements, 103, to receive microwaves of a number of frequencies.

Figure 11A:
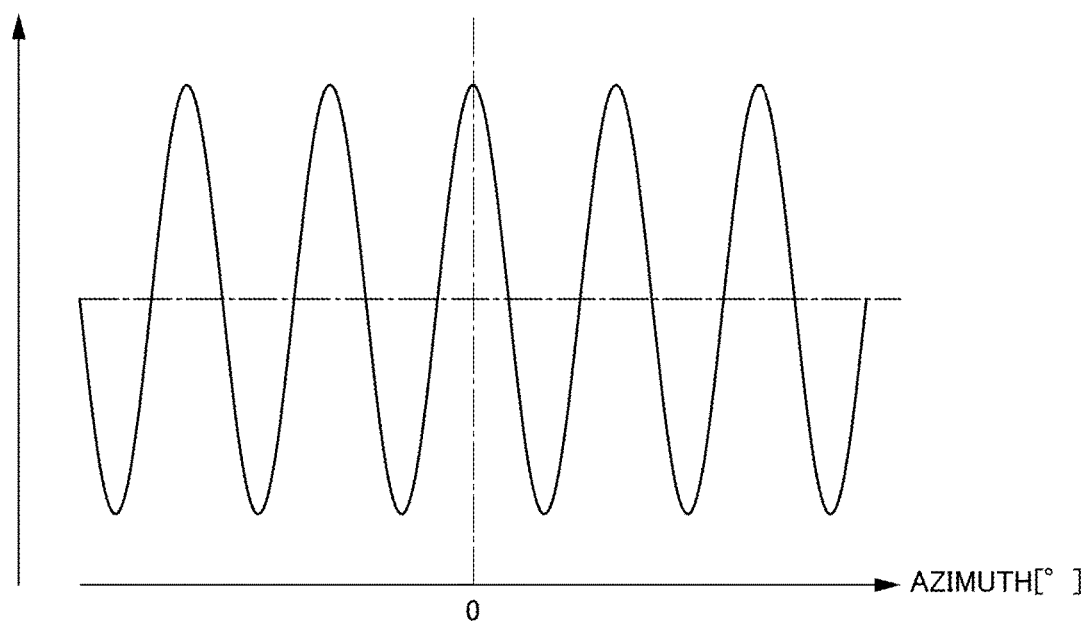
FIG. 11 shows the result of receiving a microwave signal of a single frequency using two antenna elements and performing cross-spectrum calculation processing. The result is receiving the microwave signals of three different frequencies using two antenna elements and performing cross-spectrum calculation processing.

FIG. 11A is a graph schematically showing a result of receiving a microwave of a single frequency using two antenna elements, 103, and performing cross-spectrum calculation processing. The horizontal axis represents the azimuth, and the vertical axis represents the normalized cross-spectrum intensity.

Figure 11B:
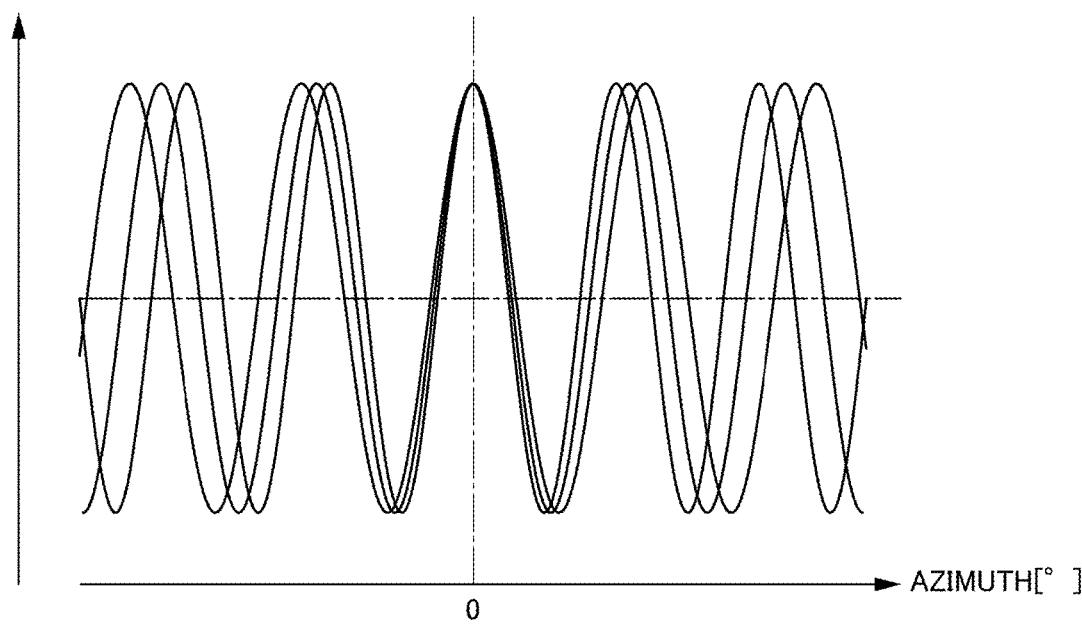

FIG. 11B shows the result of receiving microwaves of three different frequencies using two antenna elements, 103, and performing cross-spectrum calculation processing. The horizontal axis represents the azimuth, and the vertical axis represents the normalized cross-spectrum intensity. Therefore, there is no unit on the vertical axis.

Note that, in the schematic graphs shown in FIGS. 11A and 11B, no relative delay was given to the output data of the two antenna elements, 103.

The graph in FIG. 11A illustrates that the cross-spectrum is the maximum value at an azimuth of 0° and that the cross-spectrum periodically increases or decreases as the azimuth deviates. The area where the gain increases or decreases deviating from the center of the original azimuth is a grating lobe. Then, FIG. 11B shows that the cross-spectrum is the maximum value at the azimuth of 0° even in the case of a number of frequencies and that the grating lobe increases or decreases depending on the frequencies.

The phased-array antenna device, 101, described above, has a shape in which the antenna array is developed in the longitudinal and lateral directions, as shown in FIG. 1, to form a point-like antenna beam having sharp directivity in three-dimensional space but may be a straight antenna array if the directivity of the antenna in a two-dimensional space is considered.

The phased-array antenna device 101 described above has the following configuration.

Referring to FIG. 1, the first-row, first-column antenna element, 103a, is used as a reference and is described as a first antenna element. Then, the first-row, first-column preamplifier, 303a, which amplifies the signal output from the first-row, first-column antenna element, 103a, can be described as a first preamplifier that amplifies the signal obtained from the first antenna element.

Next, the first-row, first-column BPF group, 304a, that passes only a signal in a predetermined frequency band from the output signal of the first-row, first-column preamplifier, 303a, can be described as a first BPF that passes only a signal in a predetermined frequency band from the output signal of the first preamplifier.

Next, the first-row, first-column A/D converter group, 305a, that converts the output signal of the first-row, first-column BPF group, 304a, into digital data can be described as a first A/D converter that converts the output signal of the first BPF into digital data.

Next, the first-row, first-column FFT group, 301a, performs a Fourier transform on the data output from the first-row, first-column A/D converter group, 305a, and can be described as a first FFT on the data output from the first A/D converter.

Next, the first-row second-column antenna element, 103b, arranged next to the first-row, first-column antenna element, 103a, spaced apart by distance d, can be described as a second antenna element arranged apart from the first antenna element by a predetermined distance.

Next, the first-row second-column preamplifier, 303b, that amplifies the signal output from the first-row second-column antenna element, 103*b*, can be described as a second preamplifier that amplifies the signal obtained from the second antenna element.

Next, the first-row second-column BPF group, 304*b*, that passes only a signal in a predetermined frequency band from the output signal of the first-row second-column preamplifier, 303*b*, can be described as a second BPF that passes only a signal in a predetermined frequency band from the output signal of the second preamplifier.

Next, the first-row second-column A/D converter group, 305*b*, converts the output signal of the first-row second-column BPF group, 304*b*, into digital data and can be described as a second A/D converter that converts the output signal of the second BPF into digital data.

Next, the first-row second-column FFT group, 301*b*, performs a Fourier transform on the data output from the first-row second-column A/D converter group, 305*b*, and can be described as a second FFT on the data output from the second A/D converter.

Next, the first cross-spectrum calculation unit group 302*a*, which multiplies the output data of the first-row, first-column FFT group, 301*a*, and the output data of the first-row second-column FFT group, 301*b*, for the same complex frequency component (after converting one of them into a conjugate complex number), can be described as a first cross-spectrum calculation unit that multiplies the output data of the first FFT and the output data of the second FFT for the same complex frequency component after converting one of them into a conjugate complex number.

Then, the clock control unit 106, which supplies a sampling clock whose output timing is relatively shifted to the first-row, first-column A/D converter group 305*a* and the first-row second-column A/D converter group 305*b*, can be described as a clock control unit that supplies a sampling clock whose output timing is relatively shifted to the first A/D converter and the second A/D converter.

Furthermore, the first-row, third-column antenna elements, 103*c*, are arranged in a straight line on which the first-row, first-column antenna element, 103*a*, and the first-row second-column antenna element, 103*b*, are arranged, spaced apart from the first-row second-column antenna element, 103*b*, by a distance that is a natural number multiple of the distance between the first-row, first-column antenna element, 103*a*, and the first-row second-column antenna element, 103*b*. The first-row, third-column antenna element, 103*c*, can be described as a third antenna element that is arranged in a straight line on which the first antenna element and the second antenna element are arranged, spaced apart from the second antenna element by a distance that is a natural number multiple of the distance between the first antenna element and the second antenna element.

Next, the first-row, third-column preamplifier, 303*c*, that amplifies the signal obtained from the first-row, third-column antenna element, 103*c*, can be described as a third preamplifier for the signal from the third antenna element.

Next, the first-row, third-column BPF group, 304*c*, that passes only a signal in the same frequency band as the first-row, first-column BPF group, 304*a*, from the output signal of the first-row, third-column preamplifier, 303*c*, can be described as a third BPF that passes only a signal in the same frequency band as the first BPF from the output signal of the third preamplifier.

Next, the first-row, third-column A/D converter group, 305*c*, that converts the output signal of the first-row, third-column BPF group, 304*c*, into digital data can be described as a third A/D converter that converts the output signal of the third BPF into digital data.

Next, the first-row, third-column FFT group, 301*c*, that performs a Fourier transform on the data output from the first-row, third-column A/D converter group, 305*c*, can be described as a third FFT that performs a Fourier transform on the data output from the third A/D converter.

Next, the fourth cross-spectrum calculation unit group, 302*d*, multiplies the output data of the first-row, first-column FFT group, 301*a*, and the output data of the first-row, third-column FFT group, 301*c*, for the same complex frequency component (after converting one of them into a conjugate complex number), and can be described as a second cross-spectrum calculation unit that multiplies the output data of the first FFT and the output data of the third FFT for the same complex frequency component after converting one of them into a conjugate complex number.

Next, the third cross-spectrum calculation unit group 302*c*, which multiplies the output data of the first-row second-column FFT group 301*b* and the output data of the first-row, third-column FFT group 301*c* for the same complex frequency component (after converting one of them into a conjugate complex number), can be described as a third cross-spectrum calculation unit that multiplies the output data of the second FFT and the output data of the third FFT for the same complex frequency component after converting one of them into a conjugate complex number.

Furthermore, the second-row, first-column antenna elements, 103*e*, are arranged in a straight line orthogonal to the straight line on which the first-row, first-column antenna element, 103*a*, and the first-row second-column antenna element, 103*b*, are arranged and in a straight line intersecting the first-row, first-column antenna element, 103*a*, spaced apart from the first-row, first-column antenna element, 103*a*, by a distance that is a natural number multiple of the distance between the first-row, first-column antenna element, 103*a*, and the first-row second-column antenna element, 103*b*. The second-row, first-column antenna element, 103*e*, can be described as a fourth antenna element that is arranged in a straight line orthogonal to the straight line on which the first antenna element and the second antenna element are arranged in a straight line intersecting the first antenna element, spaced apart from the first antenna element by a distance that is a natural number multiple of the distance between the first antenna element and the second antenna element.

For the second-row, first-column antenna element, 103*e*, there is a preamplifier, not shown in FIG. 4, that amplifies the signal obtained from the second-row, first-column antenna element, 103*e*, similarly to the first-row, first-column antenna element, 103*a*, the first-row second-column antenna element, 103*b*, the first-row, third-column antenna element, 103*c*, and the first-row, fourth-column antenna element, 103*d*. This second preamplifier can be described as a fourth preamplifier that amplifies the signal obtained from the fourth antenna element.

Similarly, for the preamplifier that amplifies the signal obtained from the second-row, first-column antenna element, 103*e*, there is a BPF group, not shown in FIG. 4, that passes only a signal in the same frequency band as the first-row, first-column BPF group, 304*a*, from the output signal of the preamplifier. This second BPF group can be described as a fourth BPF that passes only a signal in the same frequency band as the first BPF from the output signal of the fourth preamplifier.

Similarly, for the BPF group that passes only a signal in a predetermined frequency band from the signal obtained from the second-row, first-column antenna element, 103*e*, there is an A/D converter group, which is not shown in FIG.

4, that converts the output signal of the BPF group into digital data. This second A/D converter group can be described as a fourth A/D converter that converts the output signal of the fourth BPF into digital data.

Similarly, for the A/D converter group that converts the signal obtained from the second-row, first-column antenna element, 103e, into digital data, an FFT (not shown in FIG. 4) performs a Fourier transform on the output data of the A/D converter group. This second FFT can be described as a fourth FFT that performs Fourier transform on the data output from the fourth A/D converter.

Then, the fifth cross-spectrum calculation group, 402a (not shown in FIG. 4), includes six cross-spectrum calculation unit groups, 302 (not shown), that process signals of the first-row, first-column antenna element, 103a, the second-row, first-column antenna element, 103e, the third-row, first-column antenna element, 103i, and the fourth-row, first-column antenna element, 103m. Therefore, for the fifth cross-spectrum calculation group, 402a, there is a cross-spectrum calculation unit group, which corresponds to the first cross-spectrum calculation unit group, 302a, in FIG. 4, that processes signals of the first-row, first-column antenna element, 103a, and the second-row, first-column antenna element, 103e. The cross-spectrum calculation unit group can be described as a fourth cross-spectrum calculation unit that multiplies the first FFT's output data and the fourth FFT's output data for the same complex frequency components after converting one of them into a conjugate complex number.

The combination of the arrangement of the antenna elements, 103, and the cross-spectrum calculation unit group, 302, using the technique disclosed in Non-Patent Literature 2 describing FIGS. 1 to 4, is a technique for achieving sharp directivity of the phased-array antenna device, 101. For this reason, regarding the positional relation between the first antenna element and the second antenna element, the positional relation between the first antenna element and the fourth antenna element, and so on, only the combination of the positions corresponding to the sides of the square frame, 102, shown in FIG. 1, has been described. The phased-array antenna device, 101, achieves the arrangement of the antenna elements, 103, corresponding to the technique in Non-Patent Literature 2 at the positions corresponding to the sides of the frame, 102. Therefore, the number of the cross-spectrum calculation unit groups, 302, of the above phased-array antenna device, 101, is 48, as described above.

Meanwhile, the phased-array antenna device, 101, according to the embodiment of this invention, is not limited to the combination of the arrangement of the antenna elements 103 and the cross-spectrum calculation unit group, 302, based on the technique disclosed in Non-Patent Literature 2.

If the phased-array antenna device, 101, is not to achieve a sharp directivity but to obtain reception radio wave signals having various directivities quickly, the combination of the antenna elements, 103, may not necessarily be based on the technique disclosed in Non-Patent Literature 2. For example, it is also possible to provide the cross-spectrum calculation unit group, 302, in combination with the antenna elements, 103, as a diagonal in the square frame, 102, as in the positional relation between the second antenna element and the fourth antenna element.

Considering all the combinations of the antenna elements, 103, in this manner, in the phased-array antenna device, 101, in this invention, $_{16}C_{15}=(16\times15)\div(2\times1)=120$ combinations of the antenna elements, 103, can be assumed. Therefore, in the phased-array antenna devices, 101, in this invention, the number of cross-spectrum calculation unit groups, 302, is not limited to 48, and 120 cross-spectrum calculation unit groups, 302, can be arranged.

The phased-array antenna device, 101, has been described in the embodiment of this invention.

The phased-array antenna device, 101, according to the embodiment of this invention, uses a combination of the antenna elements, 103, from which redundancy is eliminated and directly performs a second A/D conversion on analog signals over a broad frequency range immediately under the antenna elements, 103. At that time, by relatively shifting the supply timing of the sampling clock supplied to the A/D converter according to the desired azimuth with respect to the output analog signals of the two antenna elements, 103, a time difference is given to the digital output data obtained from the two antenna elements, 103. The time difference is obtained by multiplying the number of steps to shift the sampling clock according to the distance between the two antenna elements, 103, by a natural number.

The data output from the A/D converter is converted into complex frequency component data by the FFT, 505. The complex frequency component data output from the FFTs, 505, of two systems is multiplied after the complex frequency component data output from one of the FFTs, 505, is converted into a conjugate complex number by the cross-spectrum calculation unit. The complex frequency component data output from the cross-spectrum calculation unit is added for each of the same time and the same frequency component and then time-integrated to obtain the intensity data of the complex frequency component.

The phased-array antenna device, 101, according to the embodiment of this invention, employs a technical approach different from a conventional technique for handling radio waves. Typically, when high-frequency signals based on radio waves obtained from antennas are handled, tuning circuits and down-conversion to intermediate frequencies, and so on, are used. However, the phased-array antenna device, 101, according to the embodiment of this invention, does not use a tuning circuit, a PLL, an intermediate frequency, or so on. The signal obtained from the antenna is directly A/D converted after passing through the BPF and converted into data in a frequency domain by the FFT, 505. In this series of analog signal processing, a tuning circuit or so on is not used.

With a BPF at a preceding stage of the A/D converter, a signal having a frequency higher than a frequency that can be sampled by the A/D converter is detected using aliasing. In addition, by setting the sampling frequency to an integral multiple of a hexadecimal number, a data sample suitable for the FFT, 505, is provided.

As described above, it is possible for the phased-array antenna device, 101, according to the embodiment of this invention, to detect weak electromagnetic waves over an extensive frequency range for each frequency component with a technical approach and various contrivances significantly different from conventional techniques for wireless communication and microwave radiometers. In addition, since the phased-array antenna device, 101, according to the embodiment of this invention, does not use any mechanically movable component, it is evident that the operating lifespan is longer than those of conventional products.

In addition, since the phased-array antenna device, 101, does not need to be rotated, it is possible to easily increase the scale of the device as compared with conventional products. This is advantageous in terms of the spatial resolution of antenna devices.

The embodiment of this invention has been described above, but this invention is not limited to the above embodiment and includes other modifications and application examples without departing from the gist of this invention described in the claims.

The invention claimed is:
1. A phased-array antenna device comprising:
a first antenna element;
a first preamplifier configured to amplify a signal obtained from the first antenna element;
a first BPF configured to pass only a signal in a predetermined frequency band from an output signal of the first preamplifier;
a first A/D converter configured to convert an output signal of the first BPF into digital data;
a first FFT configured to perform a Fourier transform on data output from the first A/D converter;
a second antenna element arranged apart from the first antenna element by a predetermined distance;
a second preamplifier that amplifies a signal obtained from the second antenna element;
a second BPF configured to pass only a signal in the same frequency band as the first BPF from an output signal of the second preamplifier;
a second A/D converter configured to convert an output signal of the second BPF into digital data;
a second FFT configured to perform a Fourier transform on data output from the second A/D converter;
a first cross-spectrum calculation unit configured to multiply output data of the first FFT and output data of the second FFT for the same complex frequency component after converting one of the output data of the first FFT and the output data of the second FFT into a conjugate complex number; and
a clock control unit that is configured to supply a sampling clock whose output timing is shifted relative to the first and second A/D converters.

2. The phased-array antenna device according to claim 1, further comprising:
a third antenna element arranged in a straight line on which the first antenna element and the second antenna element are arranged, spaced apart from the second antenna element by a distance that is a natural number multiple of a distance between the first antenna element and the second antenna element;
a third preamplifier configured to amplify a signal obtained from the third antenna element;
a third BPF configured to pass only a signal in the same frequency band as the first BPF from an output signal of the third preamplifier;
a third A/D converter configured to convert an output signal of the third BPF into digital data;
a third FFT configured to perform a Fourier transform on data output from the third A/D converter;
a second cross-spectrum calculation unit configured to multiply the output data of the first FFT and output data of the third FFT for the same complex frequency component after converting one of the output data of the first FFT and the output data of the third FFT into a conjugate complex number; and
a third cross-spectrum calculation unit configured to multiply the output data of the second FFT and output data of the third FFT for the same complex frequency component after converting one of the output data of the second FFT and the output data of the third FFT into a conjugate complex number, wherein the clock control unit is configured to supply, based on the desired azimuth, a sampling clock whose output timing is relatively shifted to the first A/D converter, the second A/D converter, and the third A/D converter.

3. The phased-array antenna device according to claim 2, further comprising:
a fourth antenna element arranged in a straight line orthogonal to the straight line on which the first antenna element and the second antenna element are arranged and in a straight line intersecting the first antenna element, spaced apart from the first antenna element by a distance that is a natural number multiple of a distance between the first antenna element and the second antenna element;
a fourth preamplifier configured to amplify a signal obtained from the fourth antenna element;
a fourth BPF configured to pass only a signal in the same frequency band as the first BPF from an output signal of the fourth preamplifier;
a fourth A/D converter configured to convert an output signal of the fourth BPF into digital data;
a fourth FFT configured to perform a Fourier transform on data output from the fourth A/D converter; and
a fourth cross-spectrum calculation unit configured to multiply the output data of the first FFT and output data of the fourth FFT for the same complex frequency component after converting one of the output data of the first FFT and the output data of the fourth FFT into a conjugate complex number, wherein
the clock control unit is configured to supply, based on the desired azimuth, a sampling clock whose output timing is relatively shifted to the first A/D converter, and the fourth A/D converter.

4. The phased-array antenna device according to claim 3, further comprising:
a second first BPF configured to pass only a signal in a predetermined frequency band different from the first BPF from an output signal of the first preamplifier;
a second first A/D converter configured to convert an output signal of the first BPF into digital data;
a second first FFT configured to perform a Fourier transform on data output from the second first A/D converter;
a second second BPF configured to pass only a signal in the same frequency band as the second first BPF from an output signal of the second preamplifier;
a second second A/D converter configured to convert an output signal of the second second BPF into digital data;
a second second FFT configured to perform a Fourier transform on data output from the second second A/D converter; and
a second first cross-spectrum calculation unit configured to multiply output data of the second first FFT and output data of the second second FFT for the same complex frequency component after converting one of the output data of the second first FFT and the output data of the second second FFT into a conjugate complex number, wherein
the clock control unit is configured to supply the same sampling clock as the first A/D converter to the second first A/D converter and to supply the same sampling clock as the second A/D converter to the second second A/D converter.

5. The phased-array antenna device, according to claim 4, wherein the clock control unit is configured to generate a sampling clock having a frequency of an integer multiple of the number of a power of two.

* * * * *